US010686447B1

(12) United States Patent
Wang et al.

(10) Patent No.: US 10,686,447 B1
(45) Date of Patent: Jun. 16, 2020

(54) MODULAR FIELD PROGRAMMABLE GATE ARRAY, AND METHOD OF CONFIGURING AND OPERATING SAME

(71) Applicant: Flex Logix Technologies, Inc., Mountain View, CA (US)

(72) Inventors: Cheng C. Wang, San Jose, CA (US); Anthony Kozaczuk, Burlingame, CA (US); Geoffrey R. Tate, Portola Valley, CA (US)

(73) Assignee: Flex Logix Technologies, Inc., Mountain View, CA (US)

( * ) Notice: Subject to any disclaimer, the term of this patent is extended or adjusted under 35 U.S.C. 154(b) by 0 days.

(21) Appl. No.: 16/374,735

(22) Filed: Apr. 3, 2019

Related U.S. Application Data

(60) Provisional application No. 62/676,936, filed on May 26, 2018, provisional application No. 62/656,525, filed on Apr. 12, 2018.

(51) Int. Cl.
*H03K 19/17728* (2020.01)
*H03K 19/17736* (2020.01)
*H03K 19/1776* (2020.01)

(52) U.S. Cl.
CPC ... *H03K 19/17728* (2013.01); *H03K 19/1776* (2013.01); *H03K 19/17744* (2013.01)

(58) Field of Classification Search
CPC ....... H03K 19/17728; H03K 19/17744; H03K 19/1776
USPC .......................................................... 326/41
See application file for complete search history.

(56) References Cited

U.S. PATENT DOCUMENTS

| 5,212,652 A * | 5/1993 | Agrawal ............ H03K 19/1737 326/41 |
| 5,682,107 A | 10/1997 | Tavana |
| 5,933,023 A | 8/1999 | Young |
| 6,075,380 A | 6/2000 | Lane |
| 6,094,066 A | 7/2000 | Mavis |
| 6,211,695 B1 | 4/2001 | Agrawal |

(Continued)

FOREIGN PATENT DOCUMENTS

EP 1 005 163 A2 5/2000

OTHER PUBLICATIONS

Vivado Design Suite User Guide, Partial Reconfiguration, Xilinx, UG909, dated Apr. 5, 2017.

*Primary Examiner* — Don P Le
(74) *Attorney, Agent, or Firm* — Neil A. Steinberg

(57) ABSTRACT

An integrated circuit comprising an FPGA including programmable/configurable logic circuitry having a periphery, wherein resources (e.g., memory (e.g., high-speed local RAM), one or more busses, and/or circuitry external to the FPGA (e.g., a processor, a controller and/or system/external memory), is/are disposed outside the periphery of the programmable/configurable logic circuitry which includes a plurality of logic tiles, wherein at least one logic tile is located completely within the interior of the periphery and wherein each logic tile of the array of logic tiles includes a plurality of I/Os located on the perimeter of the logic tile wherein a first portion of the I/Os are located on a perimeter of the logic tile that is interior to the periphery, and the first portion of I/Os of each logic tile of the plurality of the logic tiles are directly connected to the bus to provide communication between the resources and the logic tiles.

23 Claims, 28 Drawing Sheets

(56) References Cited

U.S. PATENT DOCUMENTS

| | | |
|---|---|---|
| 6,671,865 B1 | 12/2003 | Ali et al. |
| 7,518,402 B2 | 4/2009 | Schmit et al. |
| 8,493,090 B1 | 7/2013 | Trimberger |
| 9,432,298 B1 * | 8/2016 | Smith ................ H04L 49/9057 |
| 2003/0005402 A1 * | 1/2003 | Bal .................. H03K 19/17736 326/38 |
| 2004/0010767 A1 | 1/2004 | Agrawal et al. |
| 2004/0113655 A1 | 6/2004 | Curd et al. |
| 2005/0030912 A1 * | 2/2005 | Logvinov ............ C07D 223/08 370/295 |
| 2005/0050522 A1 | 3/2005 | Kami et al. |
| 2007/0200594 A1 | 8/2007 | Levi et al. |
| 2008/0024165 A1 * | 1/2008 | Madurawe ....... H03K 19/17736 326/41 |
| 2008/0218202 A1 | 9/2008 | Arriens et al. |
| 2008/0258761 A1 | 10/2008 | Hutchings et al. |
| 2009/0002022 A1 | 1/2009 | Hutchings et al. |
| 2011/0012640 A1 | 1/2011 | Vorbach et al. |
| 2011/0121366 A1 | 5/2011 | Or-Bach et al. |
| 2012/0012895 A1 | 1/2012 | Or-Bach et al. |
| 2012/0286822 A1 | 11/2012 | Madurawe |
| 2015/0100756 A9 | 4/2015 | Vorbach et al. |
| 2016/0246712 A1 | 8/2016 | Vucinic et al. |
| 2016/0321081 A1 | 11/2016 | Kim et al. |
| 2016/0342722 A1 | 11/2016 | Sentieys et al. |
| 2017/0063378 A1 | 3/2017 | Tate et al. |
| 2018/0343010 A1 | 11/2018 | Kozaczuk et al. |

* cited by examiner

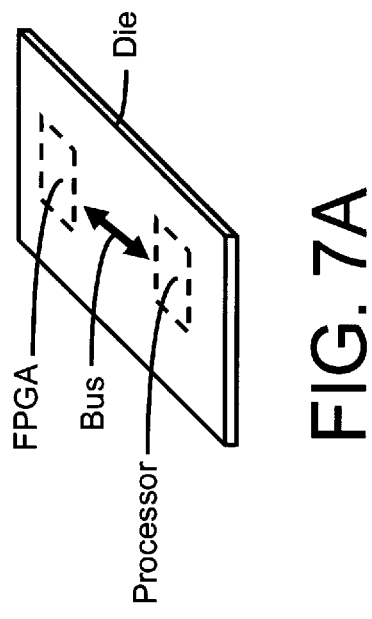
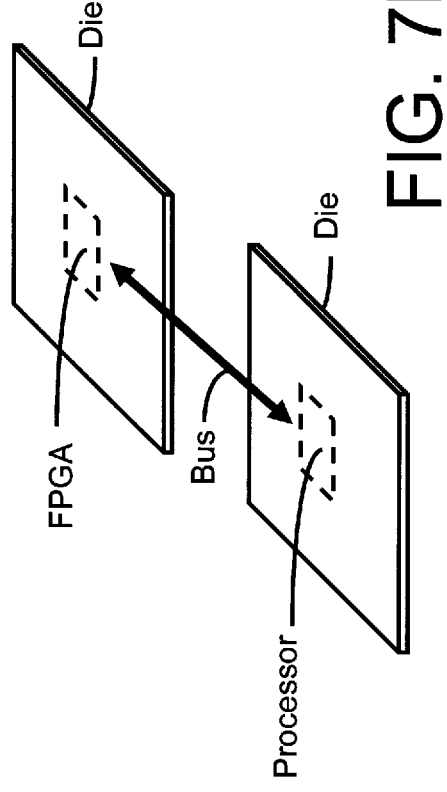
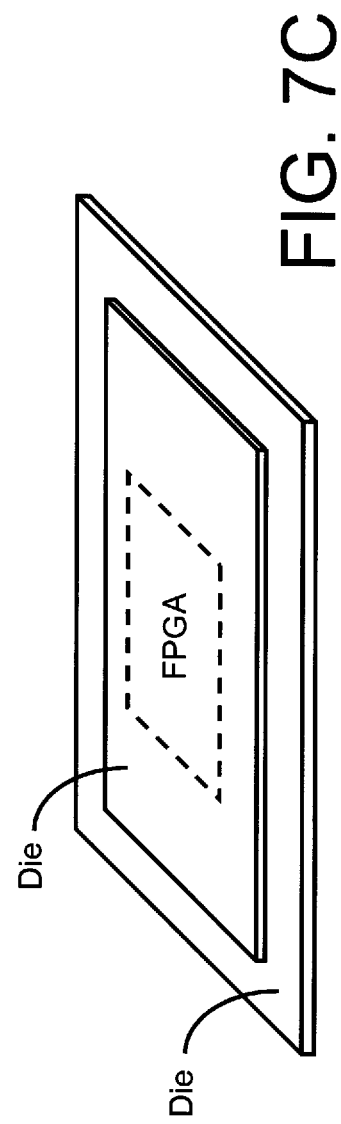

MODULAR FIELD PROGRAMMABLE GATE ARRAY, AND METHOD OF CONFIGURING AND OPERATING SAME

RELATED APPLICATION

This non-provisional application claims priority to and the benefit of U.S. Provisional Application No. 62/656,525, entitled "Modular Field Programmable Gate Array, and Method of Configuring and Operating Same", filed Apr. 12, 2018, and U.S. Provisional Application No. 62/676,936, entitled "Modular Field Programmable Gate Array, and Method of Configuring and Operating Same", filed May 26, 2018; the '525 and '936 provisional applications are hereby incorporated herein by reference in their entireties.

INTRODUCTION

In one aspect, the present inventions are directed to an integrated circuit having a field programmable gate array (FPGA) disposed therein/thereon (hereinafter collectively "therein") wherein the FPGA includes an array of logic tiles (often called "logic cells", "configurable logic blocks" (CLB), "logic array blocks" (LAB), or "logic tiles"—hereinafter collectively "logic tiles") each having programmable logic components wherein the array of logic tiles, or one or more portions thereof, is configurable/programmable or re-configurable/re-programmable (e.g., in situ (i.e., after initialization, power-up or start-up—and/or while the FPGA is operational or in operation) to perform or implement one or more functions or operations (e.g., digital signal processing, an accelerator, data encryption, data decryption, a filter, an encoder, a decoder, data compression, data decompression, network stack, and/or a state machine). The FPGA may include, among other things, a plurality of logic tiles wherein each logic tile includes a logic tile interconnect network of configurable interconnects that facilitate communication within the logic tile. In addition, the FPGA includes tile-to-tile interconnects that interconnect the logic tile interconnect network of the logic tiles thereby providing the capability of communication between the logic tiles. The logic tile interconnect network of each logic tile may include a plurality of switch matrices (e.g., an M×N switch matrix) arranged in a plurality of switch matrix stages or switch matrices stages which are interconnected into a logic tile interconnect network via logic tile interconnects. (See, e.g., the interconnect networks described and/or illustrated in U.S. Pat. No. 9,503,092 and U.S. Provisional Patent Application No. 62/735,988). As such, logic tiles are configurable to communicate, during operation of the integrated circuit, within the logic tile (e.g., between computing elements/circuitry) as well as with at least one other logic tile of the FPGA.

In one embodiment, a first group of associated logic tiles may be programmed or configured to perform a first operation, for example, at or during initialization or start-up of the FPGA. Thereafter (e.g., upon/after completion or termination of the first operation) and while the FPGA is/remains operational or in normal operation (i.e., without re-initialization or re-start of the FPGA), the first group of associated logic tiles (or a subset thereof—which, under this circumstance, would be a second group of associated logic tiles) may be re-programmed or re-configured to perform or implement one or more different functions or operations. Here, the associated logic tiles are programmed or configured (or re-programmed or re-configured as the case may be) in situ, "on the fly" or while the FPGA is operational, functional or in operation. Notably, the re-configuration or reprogramming of the logic tiles of the FPGA may be initiated by a processor, controller and/or state machine.

In another embodiment, a first group of associated logic tiles is again programmed or configured to perform a first operation, for example, at or during initialization of the FPGA. Thereafter (e.g., upon completion of the first operation/function), a second group of associated logic tiles is programmed or configured (or re-programmed or re-configured as the case may be), while the FPGA is/remains operational (and without re-initializing the FPGA), to perform a second operation. The second may include one or more logic tiles of the first group and one or more logic tiles not in the first group. In this embodiment, the programmable/configurable logic circuitry of the FPGA is partially re-configured to perform a different operation or function while the FPGA is/remains in operation or operational. Notably, the programming or configuring of the second group of logic tiles may be independent of the operation of the other logic tiles of the FPGA—for example, the second group of logic tiles may be re-programmed or re-configured to perform the second operation or function while or during a third group of logic tiles of the array is performing a third or other operations or functions.

In one exemplary embodiment, the programmable/configurable logic circuitry of the FPGA may be functionally partitioned into a plurality of groups including a first group of logic tiles, which is configured or programmed to perform a first function or operation (e.g., data encryption), and a second group of logic tiles, which is configured or programmed to perform a second function or operation (e.g., data compression). While the FPGA is/remains operational (e.g., while the second group of logic tiles is performing the second function or operation), one or more logic tiles of first group of logic tiles may be re-configured or re-programmed to perform a third function or operation (e.g., a network stack).

In one embodiment, a plurality of logic tiles (e.g., all) and/or each group of logic tiles has access to and may communicate, using a common and dedicated interface and a common signaling/communication protocol, with the same resources (e.g., memory (e.g., high-speed local RAM), one or more busses, and/or circuitry external to the FPGA (e.g., a processor, a controller and/or system/external memory)) to be (i) programmed, configured and/or re-configured to perform one or more functions or operations, and/or (ii) implement, execute and/or perform one or more functions or operations. As such, in one embodiment, the resources are dedicated to each modular FPGA and access through the dedicated interfaces does not impact other modules accessing their similarly dedicated resources. Here, any of the logic tiles may be assigned or allocated to any group of logic tiles. Moreover, a logic tile and/or any group of logic tiles may be programmed, configured and/or re-configured in a uniform, consistent and/or the same manner regardless of logic tile and/or group of logic tiles. In this way, the plurality of logic tiles of the programmable/configurable logic circuitry of the FPGA may implement a modular computing architecture.

The groups of logic tiles of the modular computing array may be programmed, configured or defined to implement any function/operation now known or later developed. For example, in one embodiment, a first group of logic tiles (which may include one or more logic tiles) may be programmed or configured as a data encryption engine or perform a first data encryption operations and a second group of logic tiles (which may include one or more logic tiles) may be programmed or configured as a data compression engine or perform data compression operations. Thereafter, certain logic tiles of the first group (alone or with other logic tiles of the array) may be re-configured or re-programmed, while the FPGA is in operation, to perform a data decryption, filter or an encoding operation. Indeed, in one embodiment, while the FPGA is still in operation—but after the second group of logic tiles has completed the data compression operations, the programmable/configurable logic circuitry may be re-configured or re-programmed such that certain logic tiles of the first group and certain logic tiles of the second group are re-configured or re-programmed into a third group of logic tiles to perform a third operation (e.g., an FFT operation).

Again, the partial re-configuration of the logic tiles of the FPGA, in situ, may be initiated by a processor, controller and/or state machine, for example, upon completion or termination of the first operation by the first group of associated logic tiles. In one embodiment, when a group of logic tiles completes the operation/function and/or a new group of logic tiles is necessary to perform a function or operation, control circuitry (for example, processor or controller) may re-configure or re-program portions of the array of logic tiles to implement such function or operation. Where a group of logic tiles completes or terminates its function or operation, such group may notify the control circuitry. The control circuitry, after receipt of a completion or termination data/signal, may re-configure the logic tiles into one or more new/different groups of logic tiles which is/are configured or programed (or re-configured or re-programmed) to perform a new operation(s) or function(s).

Notably, the integrated circuit may be, for example, a processor, controller, state machine, gate array, system-on-chip (SOC), programmable gate array (PGA) and/or FPGA.

There are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated separately herein.

BRIEF DESCRIPTION OF THE DRAWINGS

The present inventions may be implemented in connection with embodiments illustrated in the attached drawings. These drawings show different aspects of the present inventions and, where appropriate, reference numerals or names identifying or illustrating like structures, components, materials and/or elements in different figures are labeled similarly. It is understood that various combinations of the structures, components, materials and/or elements, other than those specifically shown, are contemplated and are within the scope of the present inventions.

Moreover, there are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated separately herein. Notably, an embodiment or implementation described herein as "exemplary" is not to be construed as preferred or advantageous, for example, over other embodiments or implementations; rather, it is intended reflect or indicate the embodiment(s) is/are "example" embodiment(s).

FIG. 7A illustrates a die including an integrated circuit, in accordance with aspects and/or embodiments of the present inventions, wherein an FPGA (including the plurality of logic tiles), a processor and bus are disposed on the same die; notably, although not separately illustrated, in addition thereto or in lieu thereof, the processor may be a controller, memory and/or logic circuitry; here, the bus provide a communication path between circuitry (e.g., one or more (or all) of the logic tiles and/or associated BRAM) of the FPGA and the processor, controller, memory and/or logic circuitry as described and illustrated herein;

FIG. 7B illustrates two separate die, in accordance with aspects and/or embodiments of the present inventions, wherein the FPGA (including the plurality of logic tiles) may be disposed on a first die and a processor is disposed on the second, different die; here, the layout of the dice is co-planar (i.e., side-by-side) wherein the bus provides a communication path between the FPGA (e.g., one or more (or all) of the logic tiles and/or associated BRAM) and the processor as described and illustrated herein; notably, similar to that described above with respect to FIG. 7A, although not separately illustrated, in addition thereto or in lieu thereof, the processor may be a controller, memory and/or logic circuitry; and FIG. 7C illustrates two separate die, in accordance with aspects and/or embodiments of the present inventions, in a stacked die architecture wherein the FPGA (including the plurality of logic tiles) may be disposed in a first die which is attached or disposed on a second die including a processor; here, the layout of the dice is stacked/vertical and the bus may be connected between the dice in any manner now known or later developed, to provide a communication path between the FPGA (e.g., one or more (or all) of the logic tiles and/or associated BRAM) and processor as described and illustrated herein; notably, the dice may flipped wherein the die including the processor may be disposed or stacked on the die including the FPGA; similar to that described above with respect to FIGS. 7A and 7B, although not separately illustrated, in addition thereto or in lieu thereof, the processor may be a controller, memory and/or logic circuitry.

Figure 1A:
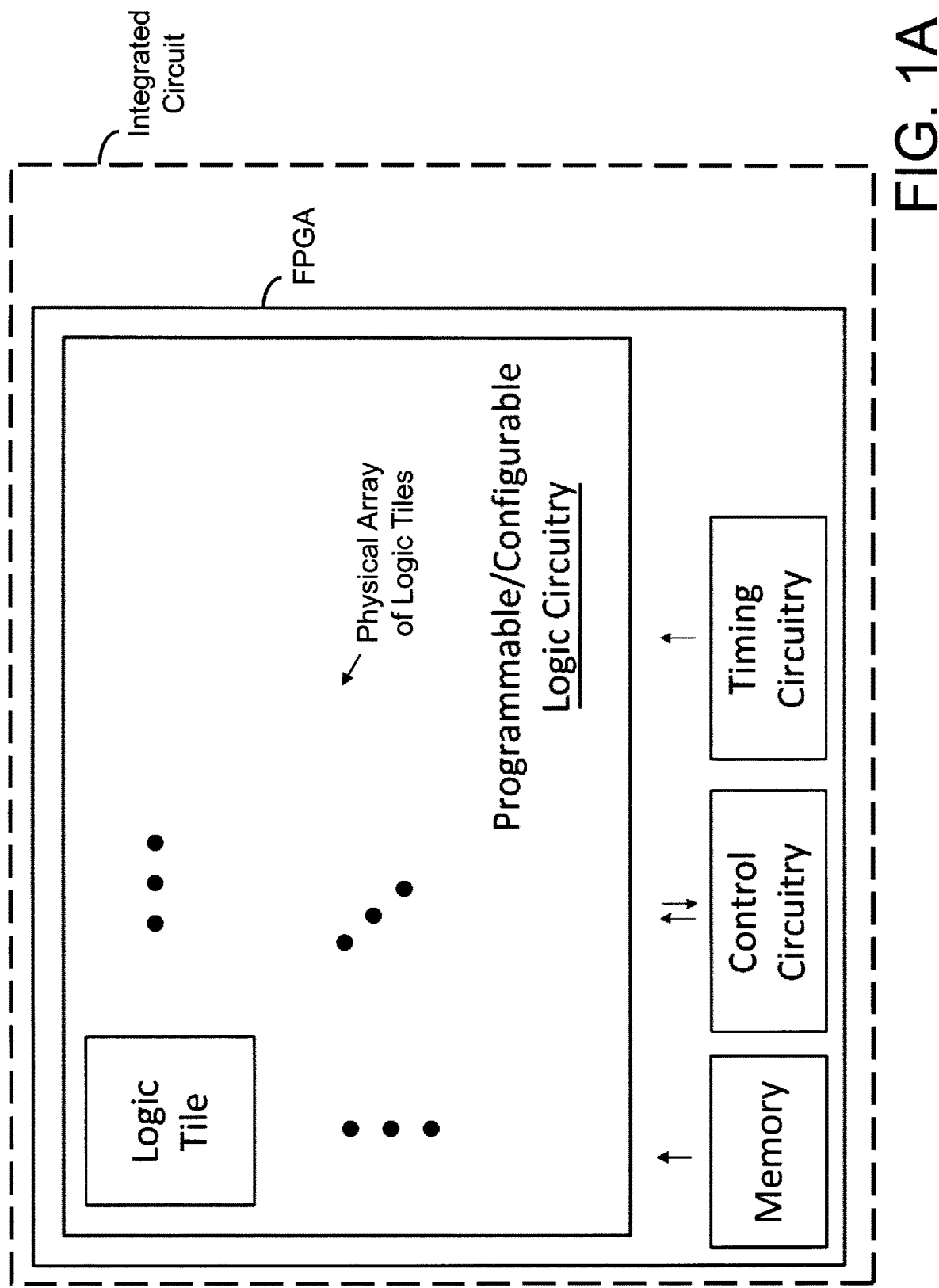
FIG. 1A illustrates a block diagram representation of, for example, an exemplary integrated circuit including control circuitry, timing or clock circuitry, power supply circuitry and programmable/configurable logic circuitry (which includes a plurality of logic tiles, each of which may include transistors configured to perform combinational and/or sequential functions (simple and/or complex) and transistors (that may be interconnected, for example, as multiplexers having two or more inputs which are electrically interconnected into a network (see, for example, the interconnect networks described and/or illustrated in U.S. Pat. No. 9,503,092 and U.S. Provisional Patent Application No. 62/735,988; the '092 patent and '988 application are incorporated herein by reference) as well as connected to, for example, associated data storage elements, input pins and/or lookup tables that, when programmed, determine the operation and connectivity of the multiplexers)); notably, in one embodiment, each logic tile of the programmable/configurable logic circuitry includes a plurality of multiplexers which are electrically interconnected into a network (for example, a hierarchical network and/or mesh, torus or the like interconnect network (hereinafter collectively "mesh network"); the switch interconnect network of each logic tile may be connected to one or more other logic tiles of the array via a configurable mesh network; indeed, in one embodiment, the highest stage of the mixed-mode switch interconnect architecture is a mesh interconnect (here, a plurality of switch matrices of the highest stage of a logic tile is connected to one or more of the switch matrices of that stage in that logic tile and one or more switch matrices of the highest stage (i.e., mesh stage) in at least one other logic tile); the lower stages of interconnect network in each logic tile may implement a hierarchical network; this notwithstanding, another mesh network/stage may be implemented as a substitute and replacement of one or more of the hierarchical network of the lower stages.
Figure 1B:
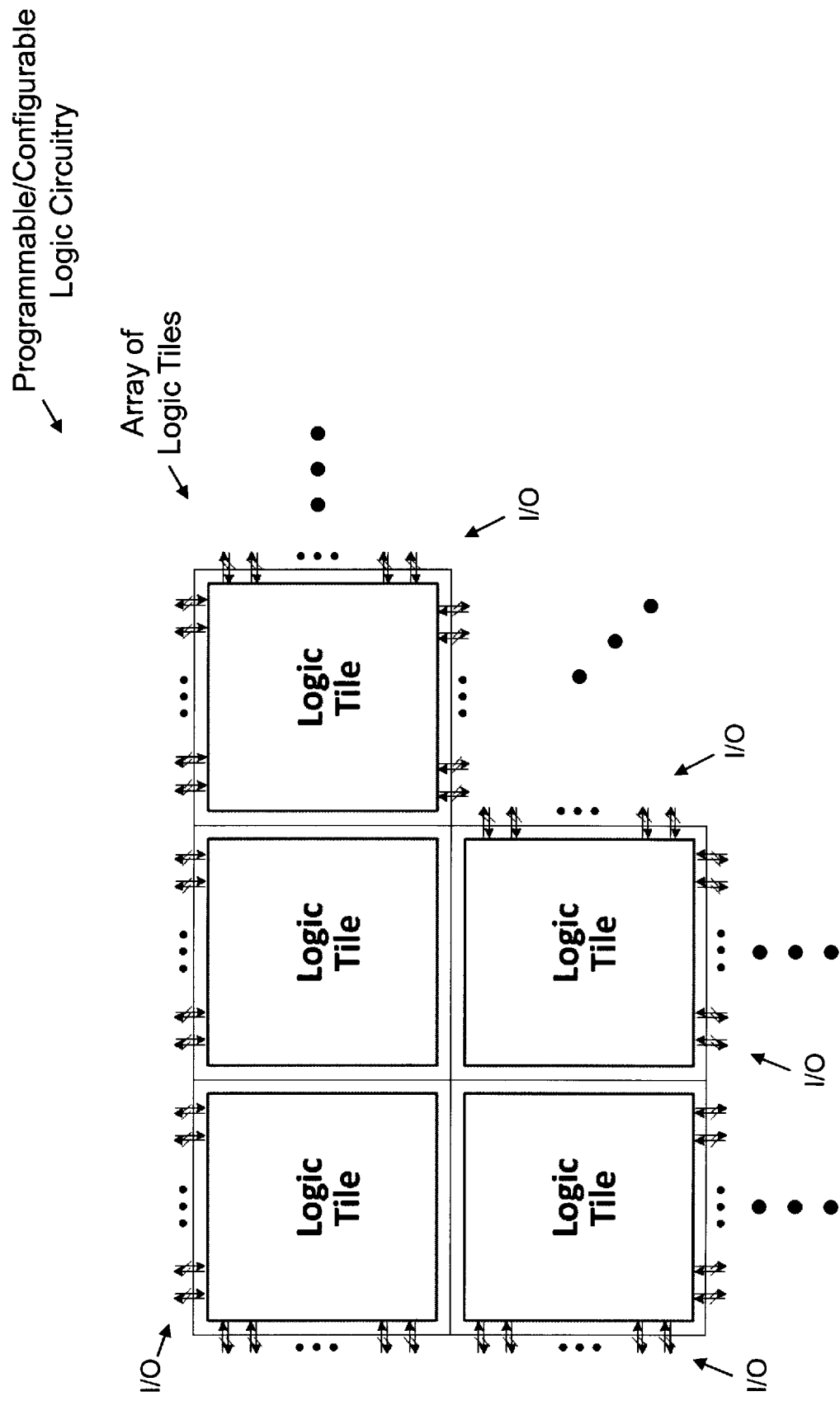
FIG. 1B illustrates, among other things, a block diagram representation of a physical array of a plurality of logic tiles of, for example, an exemplary FPGA, wherein input/output (I/Os) of the logic tiles may facilitate communication between the logic tiles and/or between certain logic tiles and circuitry external to the programmable/configurable logic circuitry; notably, the programmable/configurable logic circuitry may be comprised of a plurality of programmable logic tiles wherein each logic tile includes a plurality of multiplexers which are electrically interconnected into a network (for example, a hierarchical network and/or mesh network)
Figure 1C:
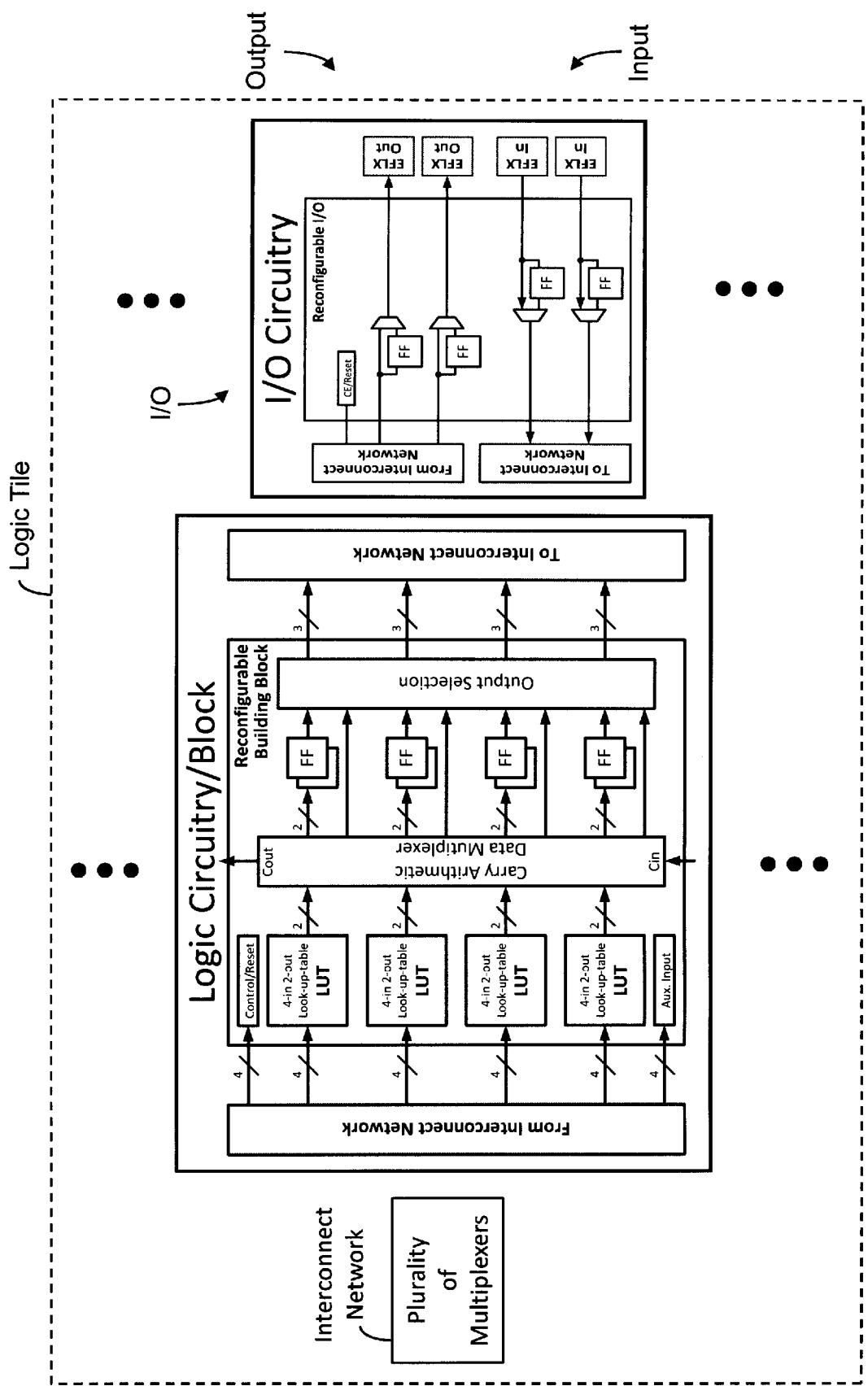
FIG. 1C illustrates a block diagram representation of a portion of an exemplary logic tile of the programmable/configurable logic circuitry of FIGS. 1A and 1B, wherein the logic tile includes logic and I/O, for example, a plurality of (i) logic blocks, each logic block including, for example, a plurality of look-up-tables, arithmetic blocks, data multiplexers, flip-flops, and control/reset circuitries, (ii) I/O (I/O circuitry or blocks, which are disposed on the periphery, perimeter or edge of the logic tile, to facilitate interconnection between circuitry of the logic tile and circuitry external to the tile (and, in one embodiment, external to the logic tile array of the programmable/configurable logic) and (iii) an interconnect network composed of one or more multiplexers or switches which may be arranged or configured into an interconnect network having a plurality of switch matrices (or stages of switch matrices) to, for example, facilitate communication between the logic tiles and/or performance of logic operation in or during normal operation of the currently configured integrated circuit; notably, the I/O (e.g., the physical points of entry/exit of the signals to the logic tile—all forms of which are intended to fall within the scope of the present invention) may be disposed along the perimeter, periphery or border of the logic tile (e.g., where the logic tile has a square or rectangle shape, on all four sides—see FIGS. 1B and 1C); notably, I/O means one input/output (which may be uni-directional conductor and/or bi-directional conductor) and/or a plurality of inputs/outputs (i.e., more than one uni-directional conductor and/or more than one bi-directional conductor)

Again, there are many inventions described and illustrated herein. An embodiment or implementation described herein as "exemplary" is not to be construed as ideal, preferred or advantageous, relative to other embodiments or implementations; rather, it is intended reflect or indicate the embodiment(s) is/are "example" or "illustrative" embodiment(s). Indeed, these inventions are neither limited to any single aspect nor embodiment thereof, nor to any combinations and/or permutations of such aspects and/or embodiments. Each of the aspects of the present inventions, and/or embodiments thereof, may be employed separately/alone or in combination with one or more of the other aspects of the present inventions and/or embodiments thereof. For the sake of brevity, many of those combinations/permutations are not discussed or illustrated separately herein.

DETAILED DESCRIPTION

The present inventions, in one aspect, are directed to FPGA layouts as well as circuitry and techniques to configurable/programmable or re-configurable/re-programmable logic tile(s) of an FPGA (e.g., in situ (i.e., after initialization, power-up or start-up—and/or while the FPGA is operational or in operation) to perform, execute or implement one or more functions or operations (e.g., digital signal processing, data encryption, data decryption, filtering, encoding, decoding, data compression and/or data decompression). The FPGA includes, among other things, a plurality of logic tiles wherein each logic tile includes a logic tile interconnect network of configurable interconnects that facilitate communication within the logic tile. In addition, the FPGA includes tile-to-tile interconnects that interconnect the logic tile interconnect network of the logic tiles thereby providing the capability of communication between the logic tiles.

In one exemplary embodiment, the logic tiles of the FPGA may be functionally partitioned to perform a plurality of discrete or interrelated function(s) or operation(s) (e.g., data encryption and/or data compression). While the FPGA is/remains operational (e.g., while a first group of logic tiles is performing a first function or operation), one or more logic tiles of a second group of logic tiles may be re-configured or re-programmed to perform a new function or operation (e.g., a encoding or decoding). In this way, the programmable/configurable logic circuitry of the FPGA implements modular computing.

The groups of logic tiles of the modular computing array may be programmed, configured or defined to implement any function/operation now known or later developed. For example, in one embodiment, a first group of logic tiles (which may include one or more logic tiles) may be programmed or configured as a data encryption engine or perform a first data encryption operations and a second group of logic tiles (which may include one or more logic tiles) may be programmed or configured as a data compression engine or perform data compression operations. Thereafter, certain logic tiles of the first group (alone or with other logic tiles of the array) may be re-configured or re-programmed, while the FPGA is remains in operation (i.e., without re-initialization), to perform a data decryption, filter or an encoding operation. Indeed, in one embodiment, while the FPGA is still in operation—but after the second group of logic tiles has completed the data compression operations, the programmable/configurable logic circuitry may be re-configured or re-programmed such that certain logic tiles of the first group and certain logic tiles of the second group are re-configured or re-programmed into a third group of logic tiles to perform a third operation (e.g., an FFT operation).

The partial re-configuration of the logic tiles of the FPGA, in situ, may be initiated by a processor, controller and/or state machine. That reconfiguration may be initiated or implemented, for example, upon completion or termination of the first operation by the first group of associated logic tiles. In one embodiment, when a group of logic tiles completes the operation/function and/or a new group of logic tiles is formed to perform a function or operation, control circuitry (for example, processor or controller) may re-configure or re-program portions of the array of logic tiles to implement such function or operation. Where a group of logic tiles completes or terminates its function or operation, such group may notify the control circuitry. The control circuitry, after receipt of a completion or termination data/signal, may re-configure the logic tiles into one or more new/different groups of logic tiles which is/are configured or programmed (or re-configured or re-programmed) to perform a new operation(s) or function(s). As discussed in detail below, in one embodiment, code (e.g., RTL, Verilog/VHDL or the like), which is employed to configure or program the logic tiles to perform a predetermined operation or function, may be read from memory which is coupled to the bus and provided to the logic tiles to configure and/or re-configure circuitry in one or more (or all) of the logic tiles in accordance therewith.

With reference to FIGS. 1A-1C, 2A and 2B, in one embodiment, the FPGA includes a programmable/configurable logic circuitry having a plurality of logic tiles (e.g., an M×N array) wherein one or more buses (e.g., which communicate data, address and/or control signals) are connected (e.g., directly) to logic tiles of the array. In one embodiment, the one or more buses (e.g., Advanced eXtensible Interface (AXI) or Network on Chip (NoC) type buses) provide a common interface (and, in one embodiment, a common and dedicated interface) for different functions or operations performed or implemented by each logic tile (or each group of logic tiles), so each logic tile may send and/or receive data to/from other circuitry or blocks (whether incorporated or implemented on other logic tiles, or outside the FPGA boundary, such as a processor or a NoC master). For example, the bus may be coupled to memory to provide data (e.g., input data) the logic tile(s) employs to perform a function or operation—such as the input data that the logic tile, which performs the function or operation, that is required. In addition, the bus may receive output data from the circuitry on the logic tile(s) after performance of the function or operation by the logic tile(s), for example, after the function or operation is complete. This common interface provides a function-agnostic method of performing data transfer/communication, regardless of which function(s) or operation(s) the logic tile(s) are performing.

Separately, the one or more buses may also provide, among other things, configuration and/or re-configuration data to the logic tiles to implement the modular computing array architecture of the present inventions. For example, the bus may be coupled to memory that stores data which is employed to configure or program the logic tiles to implement the predetermined function(s) or operation(s). In one embodiment, code (e.g., RTL, Verilog/VHDL or the like), which is employed to configure or program the logic tiles to perform a specific operation or function, may be stored in memory coupled to the bus and available to configure and/or re-configure circuitry in one or more (or all) of the logic tiles. In one embodiment, the code is read from the memory and applied to the logic tiles of the group to implement a predetermined function or operation. In this way, the logic tiles of the group are configured or programmed (or re-configured or re-programmed) to perform the function/operation defined by the code.

When a new/different operation or function is desired, the configuration of the logic tiles (e.g., the logic circuitry and/or interconnect network) is changed to implement the new/different operation or function. Here, new/different code, which is associated with the new/different operation or function, is applied to logic tiles of the array. The new/different code, when implemented, re-configures or re-programs the logic tile(s) to implement the second function or operation, in accordance with the present inventions. Notably, the particular logic tiles that may comprise the group of logic tiles employed to implement the new/different operation or function may include one, some or all of the same logic tiles of the group of tiles employed to implement the previous operation or function.

In addition thereto, or in lieu thereof, the one or more buses provide a path to input/output data to one or more groups of associated logic tiles (one or more logic tiles that have been configured or programmed (or re-configured or re-programmed)) to perform one or more functions or operations in accordance with the present inventions. Here, the group of logic tiles, after configuration and in operation, may receive input data (e.g., unencrypted and/or uncompressed data) on the bus from, for example, memory; thereafter, the logic tiles perform the specific function or operation (for which they are configured or programmed) on or using such data (e.g., data encryption and/or data compression). In one embodiment, during performance or after performing the function or operation, one or more (or all) of the group of logic tiles may output the resulting data (e.g., encrypted and/or compressed data), for example, back to memory or, alternatively, to a processor or controller. Notably, the one or more buses may be common or separate.

With reference to FIGS. 1A-1C, 2A and 2C, in one embodiment, the logic tiles include block RAM (BRAM) which is a local memory for the logic tile to, for example, write data to and read data from during operation of the logic tile, for example, during implementation of an operation or a function being performed by the group of associated logic tiles. In one embodiment the BRAM may be employed as a local or scratchpad memory for the Verilog code to employ (e.g., storing intermediate calculations of, for example, the operation or function being performed).

In one embodiment, the BRAM is disposed or located on a first side of the associated logic tile (e.g., in the illustrative embodiment, the "north" side of the logic tile) and the bus is disposed, located or routed on a second side of each of the logic tiles (e.g., in the illustrative embodiment, the "south" side of the logic tile). Here, the bus is electrically connected to I/O disposed on the second or "south" side of each of the logic tiles. In one embodiment, the bus may connect to unused external I/O on the second or "south" side of the logic tile—that is, I/O that is disposed on the perimeter of the logic tile which is not on or form a portion of the periphery or perimeter of the programmable/configurable logic circuitry.

Figure 1D:
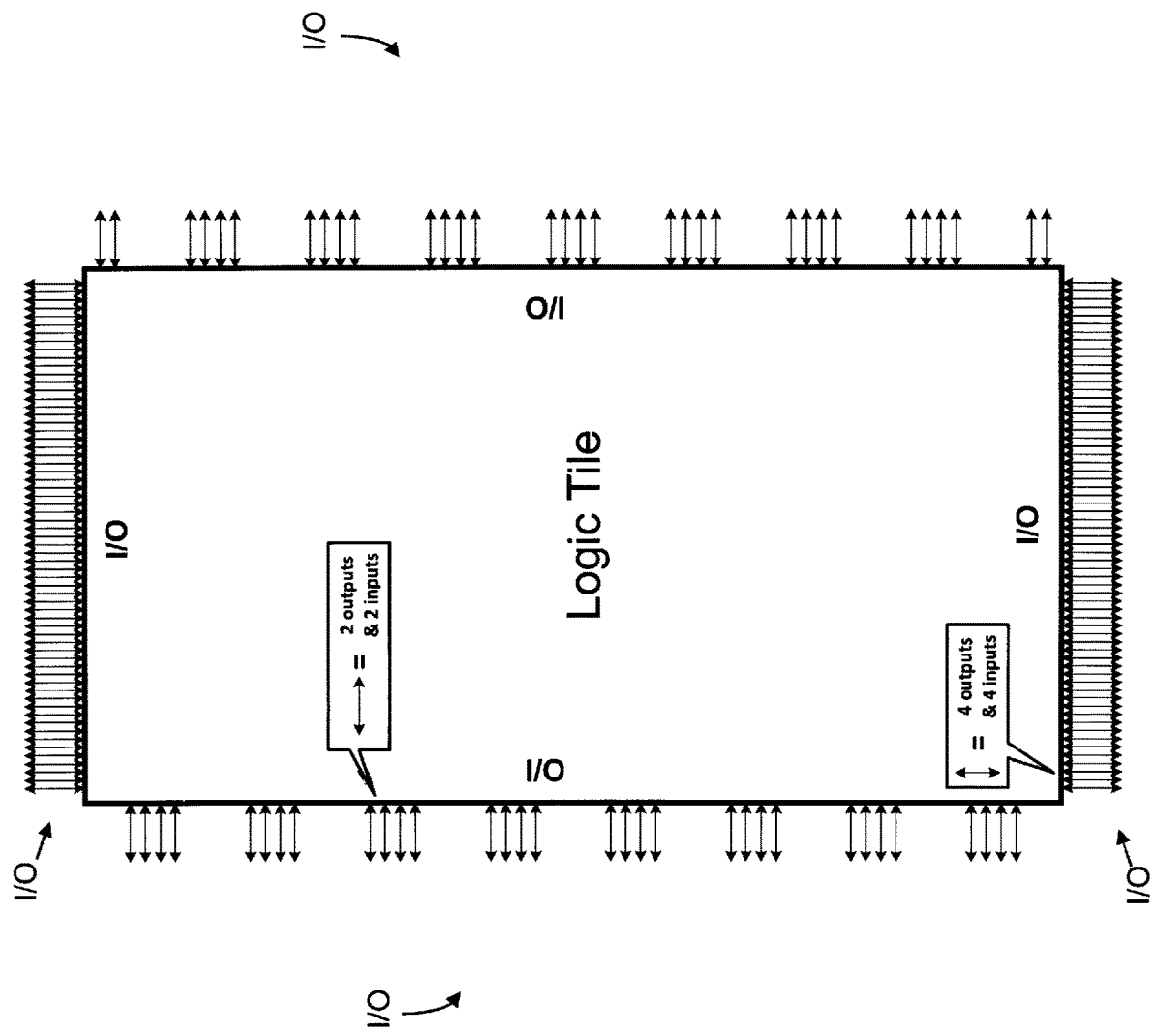
FIG. 1D illustrates a block diagram representation of an exemplary logic tile of the programmable/configurable logic circuitry of FIGS. 1A, 1B and 1C wherein I/O of the logic tile (which, in one embodiment, are electrically coupled to I/O circuitry or blocks) in this exemplary embodiment are located on all sides of the rectangular-shaped logic tile (i.e., interspersed along the entire perimeter of the logic tile (or a substantial portion thereof)); each of the logic tiles of the physical array have a common layout of the I/O on the perimeter or periphery of the logic tile; notably, the I/O illustrated herein are separate from or independent of the interconnect I/O of the logic tile—which is employed for internal connection to the interconnect network within the logic tile and/or between logic tiles of the physical array of the programmable/configurable logic circuitry (see, for example, U.S. Pat. No. 9,906,225 and U.S. Provisional Patent Application No. 62/735,988)

As intimated above, each logic tile typically includes thousands of transistors which may be configured to perform combinational and/or sequential functions (simple and/or complex). In one embodiment, each logic tile may include one or more multiplexers or switches which may be arranged in a plurality of switch matrix or switch matrices stages of an interconnect network, to, for example, perform logic operations in or during normal operation of the integrated circuit (based on that current configuration of the logic block(s)) and (ii) I/O (I/O pins and associated I/O circuitry or blocks)—for example, I/O pins, disposed on the periphery, perimeter or edge of the logic tile, and I/O circuitry or blocks associated with such I/O pins, to facilitate interconnection between circuitry of the logic tile and circuitry external to the programmable/configurable logic circuitry. (See, e.g., FIGS. 1B, 1C and 1D). In one embodiment, the I/O (I/O pins and associated I/O circuitry/blocks) of each logic tile are commonly interspersed along the entire perimeter or border of the logic tile—for example, in those situations where the logic tile has a square or rectangle shape, on all four sides. (See, e.g., FIG. 1D). Thus, in one embodiment, each logic tiles of the logic tile array has a common or identical I/O layout on the perimeter of the logic tile (which advantageously facilitates the tiling of the logic tiles of the physical array). Notably, I/O that is disposed on the perimeter of the logic tile that is located on the periphery or perimeter of the programmable/configurable logic circuitry may be employed or available to interface with circuitry external to the programmable/configurable logic circuitry. The bus may connect to the I/O disposed on the perimeter or periphery of the logic tile that is adjacent to the bus; and, in one embodiment, to the I/O on the perimeter of the logic tile which is interior to the periphery of the programmable/configurable logic circuitry (see, e.g., FIGS. 1B-1D, and FIGS. 2A-2C).

Figure 2A:
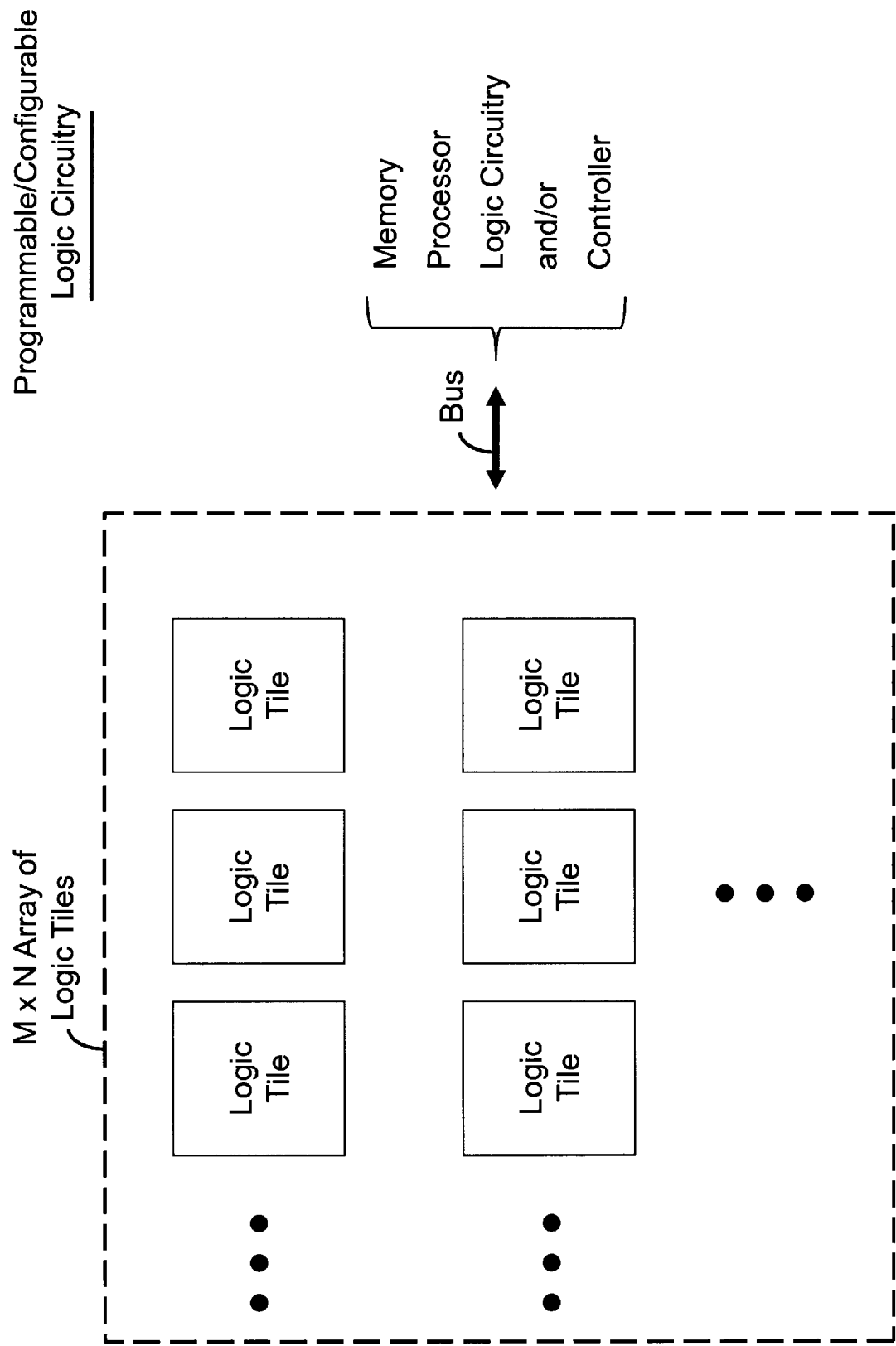
FIGS. 2A-2F illustrate, among other things, a block diagram representation of a plurality of logic tiles (arranged in an array) of, for example, an exemplary FPGA, wherein one or more buses (e.g., point-to-point and/or multi-drop) which communicate data, address and/or control signals are connected (e.g., directly) to one or more (or all) of the logic tiles (e.g., FIGS. 2B-2D) and/or BRAM (block random access memory) associated therewith (e.g., FIGS. 2D-2F), according to certain aspects and/or embodiments of the present inventions; the bus may connect to the I/O disposed on the perimeter or periphery of the logic tile that is adjacent to the bus and, in one embodiment, to the I/O on the perimeter of the logic tile which is interior to the periphery of the programmable/configurable logic circuitry (see, e.g., FIGS. 1B, 1C and 1D); the one or more buses may be, for example, Advanced eXtensible Interface (AXI) or Network on Chip (NoC) type buses; moreover, the one or more buses may provide a common interface (and, in one embodiment, a common and dedicated interface) for different functions or operations performed or implemented by each logic tile (or each group of logic tiles), so each logic tile may send and/or receive data to/from other circuitry or blocks (whether incorporated or implemented on other logic tiles, or outside the FPGA boundary, such as a processor, controller and/or NoC master); notably, the one or more buses may also provide, among other things, configuration and/or re-configuration data to the logic tiles to implement, for example, the modular computing array architecture of the present inventions; moreover, the BRAM may be one port or two port memory (i.e., dual port memory) such that the memory is accessible via the bus as well as circuitry of the logic tile (see, e.g., FIG. 2E); notably, certain of the buses may be point-to-point architectures and others may be multi-drop architectures—all combinations and permutations are intended to fall within the scope of the present inventions.
Figure 2B:
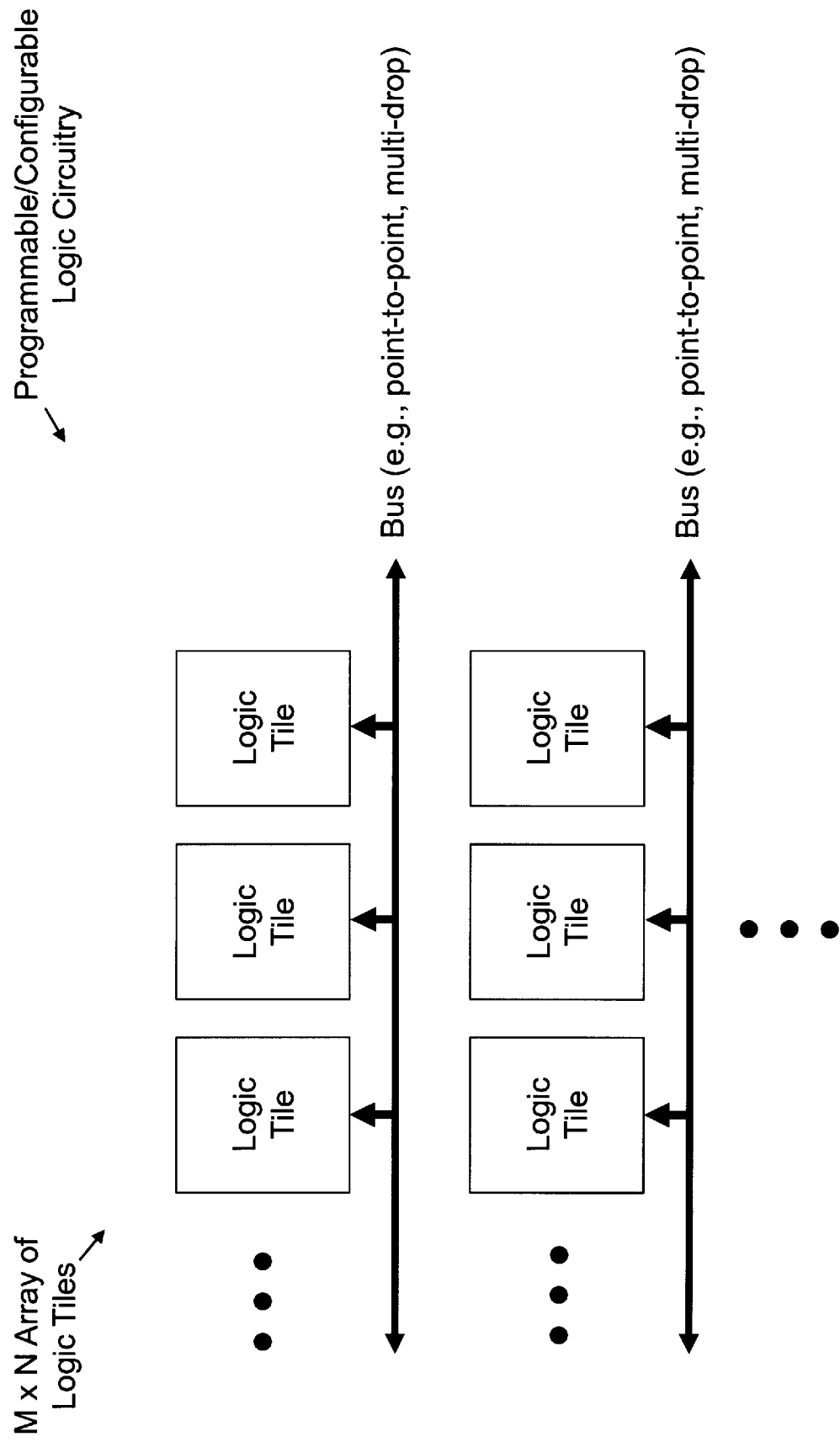
Figure 2C:
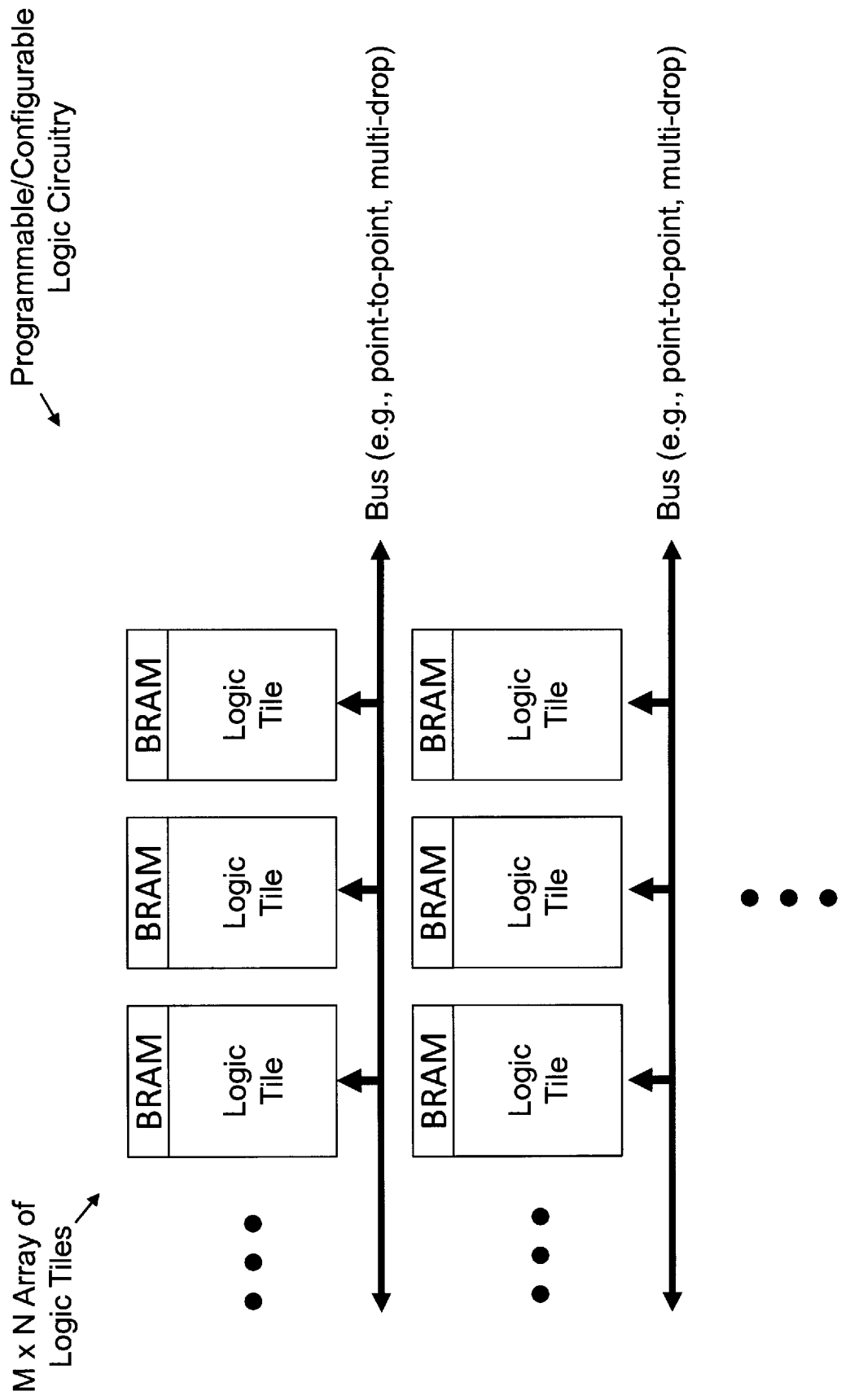
Figure 2D:
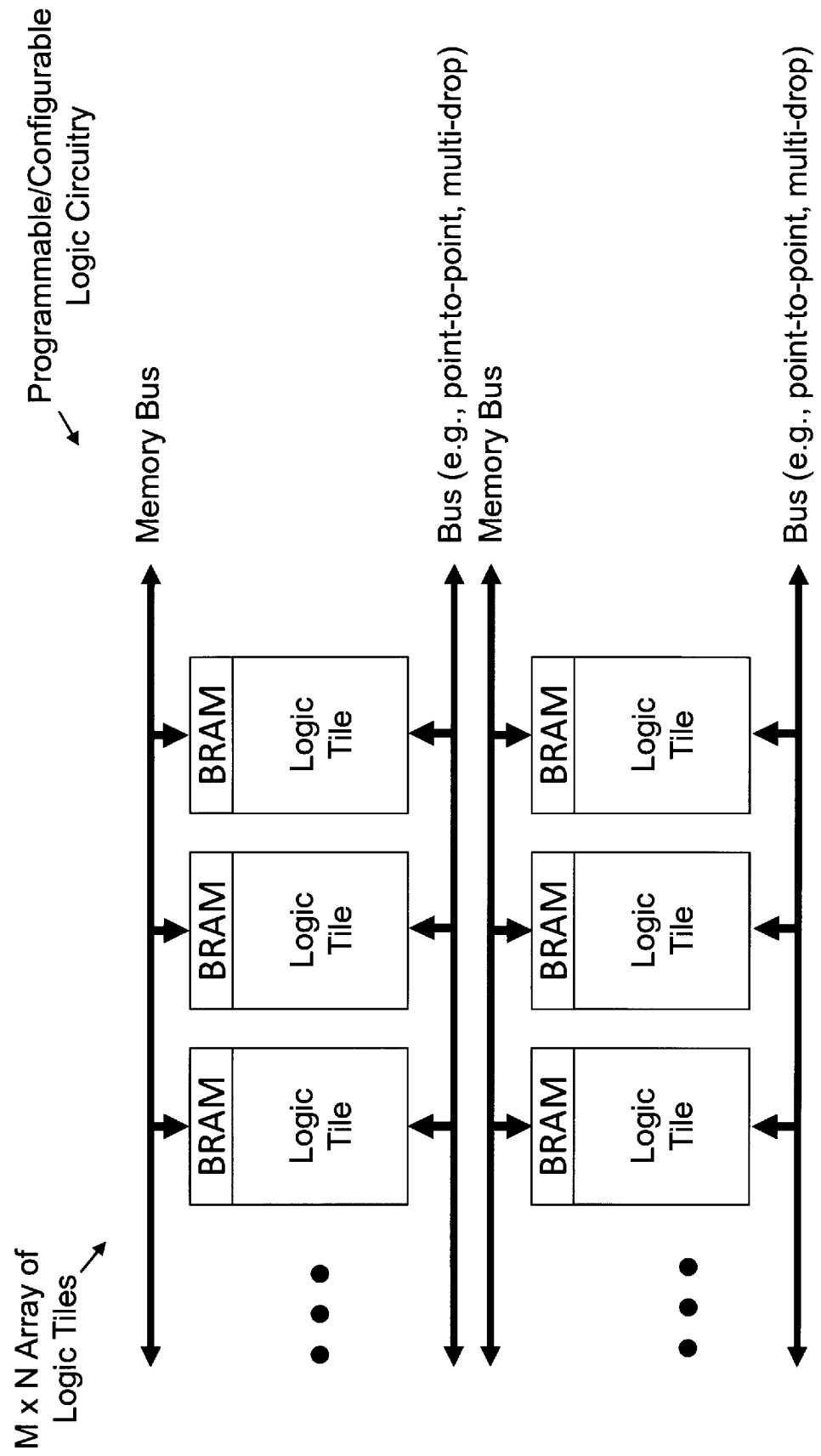
Figure 2E:
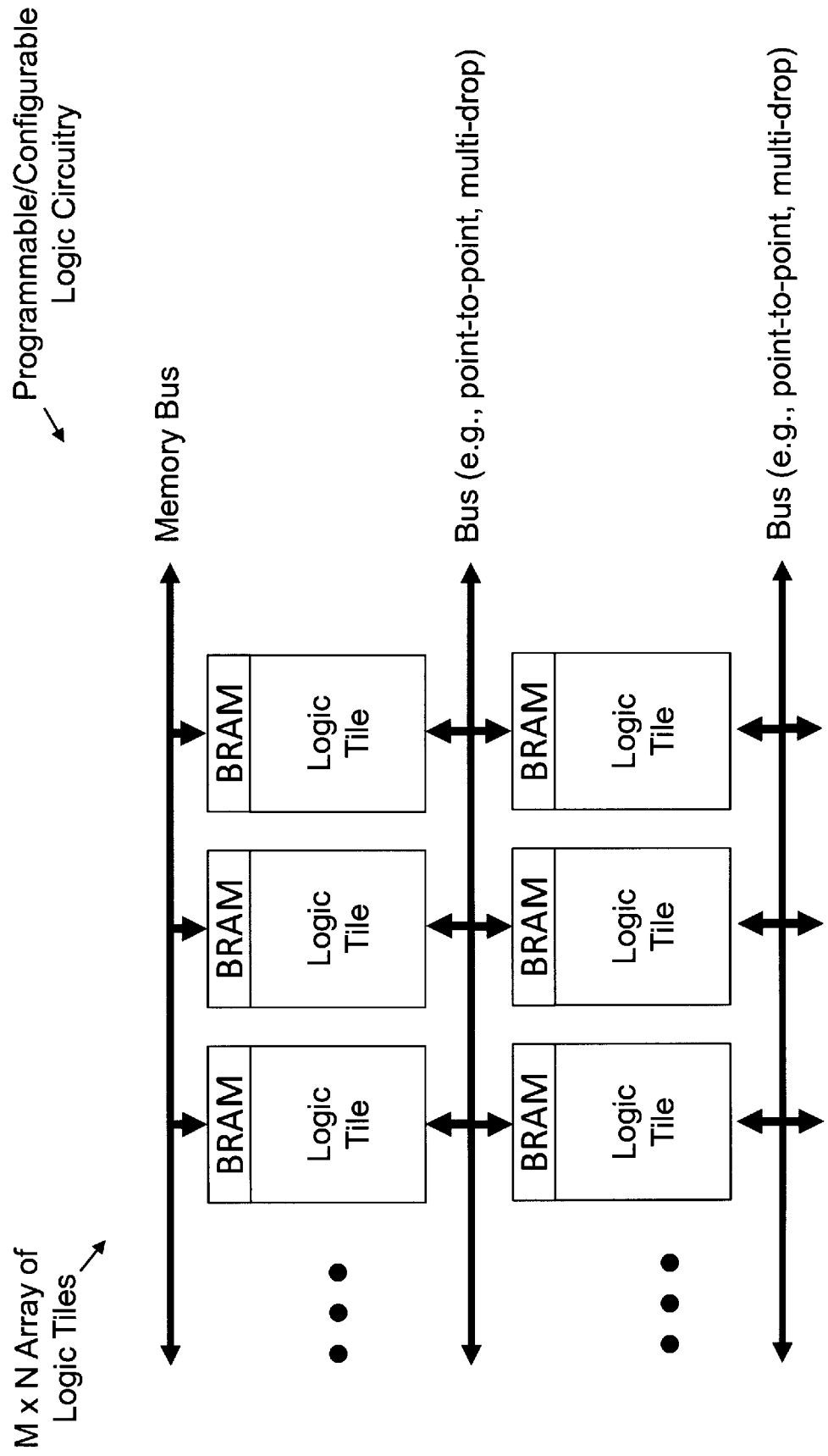
Figure 2F:
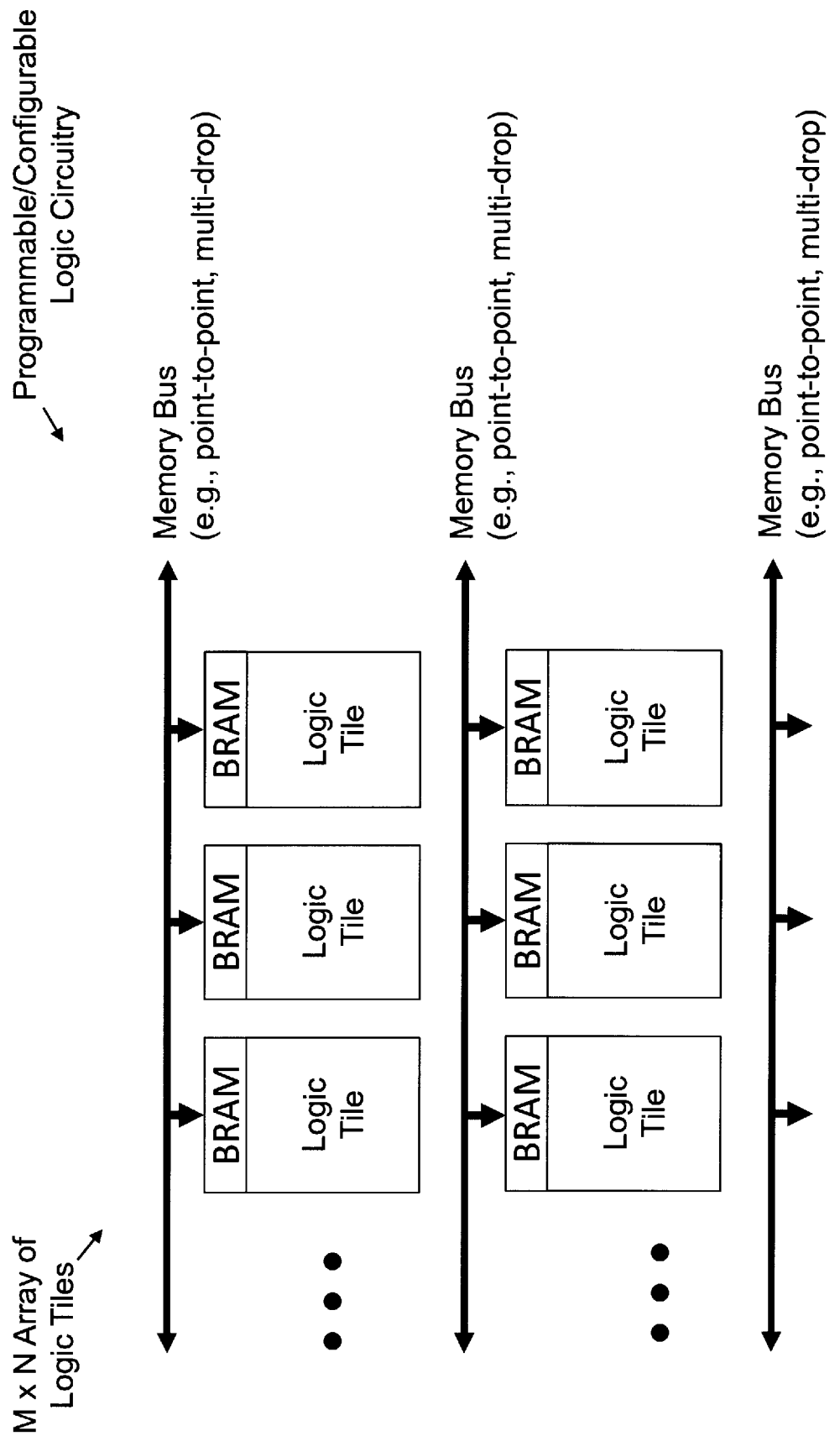

With reference to FIGS. 2D and 2F, in another embodiment, the circuitry in the logic tile may access the BRAM of the logic tile and, in addition, may access directly and separately memory located outside of the array of logic tiles (e.g., system or cache memory), via a memory bus coupled to the logic tile. In this embodiment, a memory bus is disposed, located or routed on the first side of the associated logic tile (e.g., in the illustrative embodiment, the "north" side of the logic tile). Here, the BRAM may connect directly to the I/O disposed on the perimeter or periphery of the logic tile (see, e.g., FIGS. 1B-1D and FIGS. 2D and 2F) and the memory bus disposed, located or routed that is adjacent thereto. In one embodiment, the size of the memory accessible via the memory bus may be significantly larger than the size of the BRAM. In this way, the logic tile would have access to significantly more scratch pad memory during performance of the function or operation via writing data to and reading data from the memory located outside of the array of logic tiles during operation of the logic tile.

In one embodiment, the two buses disposed between the rows of logic tiles may be combined or consolidated into a single bus, for example, to manage or reduce the size/area of the programmable/configurable logic circuitry and/or routing of bus lines between the logic tiles. (See, for example, FIG. 2E). Moreover, although illustrated as disposed, located or routed between rows of logic tiles, the buses may, in addition thereto, or in lieu thereof, be disposed, located or routed between columns of logic tiles. For the sake of brevity, the discussion and illustrations of bus routing will not be repeated for routing one or more of the bus(es) in a column direction.

Figure 4:
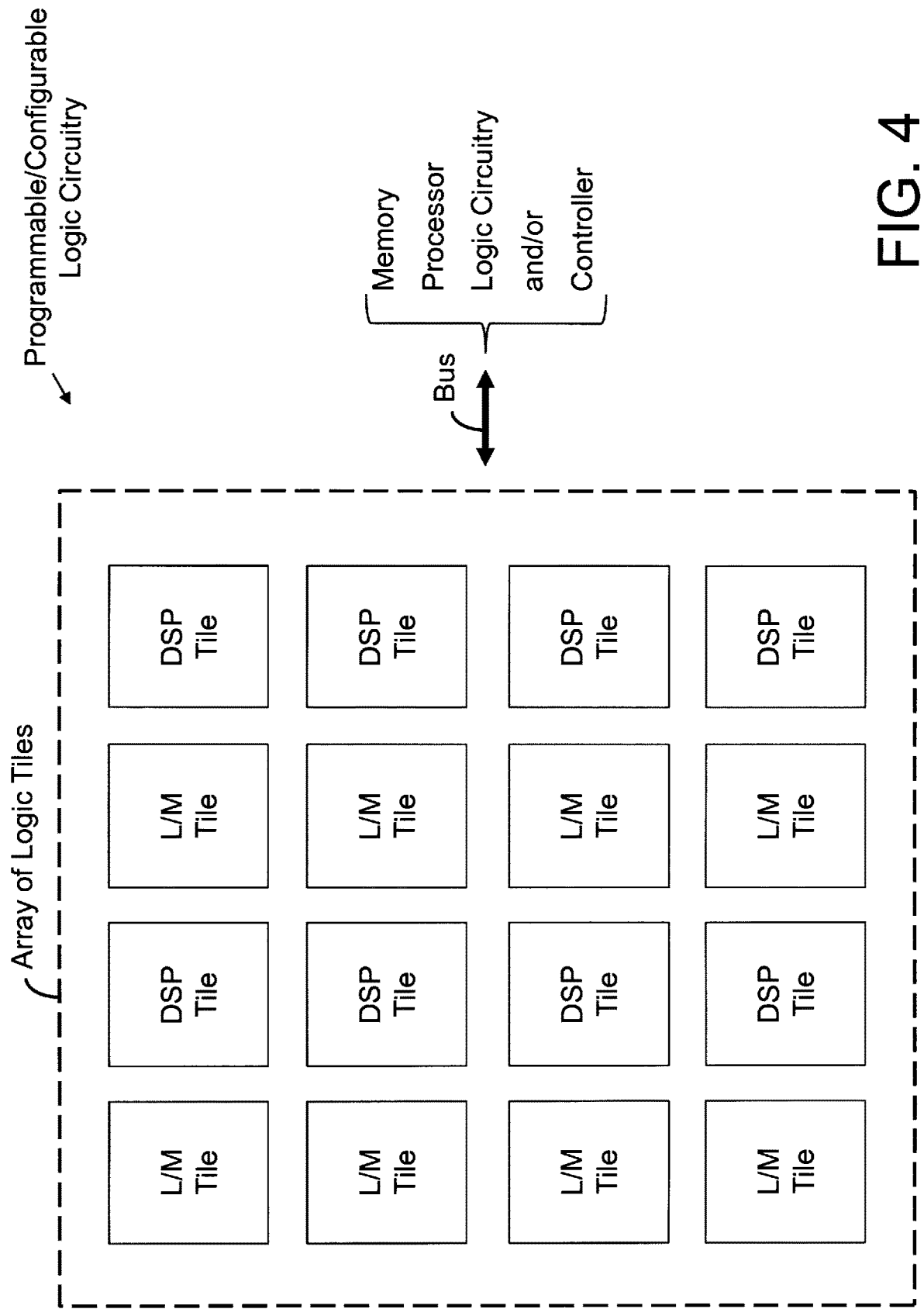
FIG. 4 illustrates an exemplary array of logic tiles, according to certain aspects and/or embodiments of the present inventions, wherein all of the logic tiles of the array are not identical—for example, in relation to the circuitry or contents therein; here, certain logic tiles may include logic and memory (L/M) whereas other logic tiles may include digital signal processing (DSP) cores; in this exemplary layout, the rows of array of logic tiles alternate between a row of L/M tiles and a row of DSP tiles; here again, the bus(es) (e.g., point-to-point and/or multi-drop architectures) provide communication (e.g., direct communication of data, address and/or control signals) between memory (e.g., external to the array of logic tiles), a processor, logic circuitry and/or a controller to facilitate, for example, configuration, re-configuration, programming, or re-programming of the logic tile(s), and operation(s) or function(s) performed thereby, of the modular computing logic tile array.
Figure 5A:
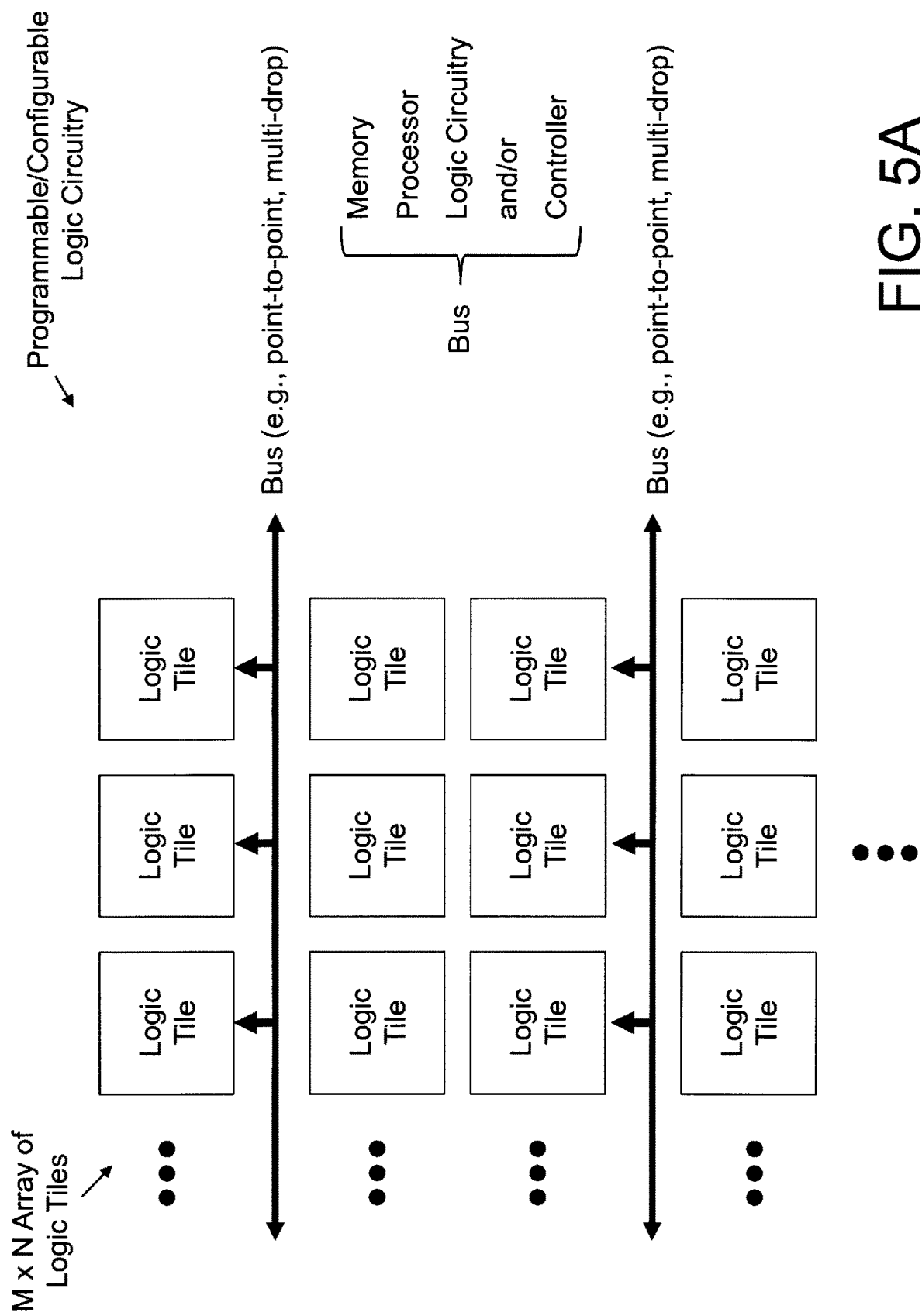
FIGS. 5A-5G illustrate, among other things, an exemplary layouts and architectures of the array of logic tiles relative to the bus, and the number of logic tiles connected to that bus, in accordance with certain aspects and/or embodiments of the present inventions; in one embodiment, the bus may connect to the I/O disposed on the perimeter or periphery of the logic tile that is adjacent to the bus and, in one embodiment, to the I/O on the perimeter of the logic tile which is interior to the periphery of the programmable/configurable logic circuitry (see, e.g., FIGS. 1B, 1C and 1D); notably, all layouts, bus routing, and architectures are intended to fall within the scope of the present inventions.
Figure 5B:
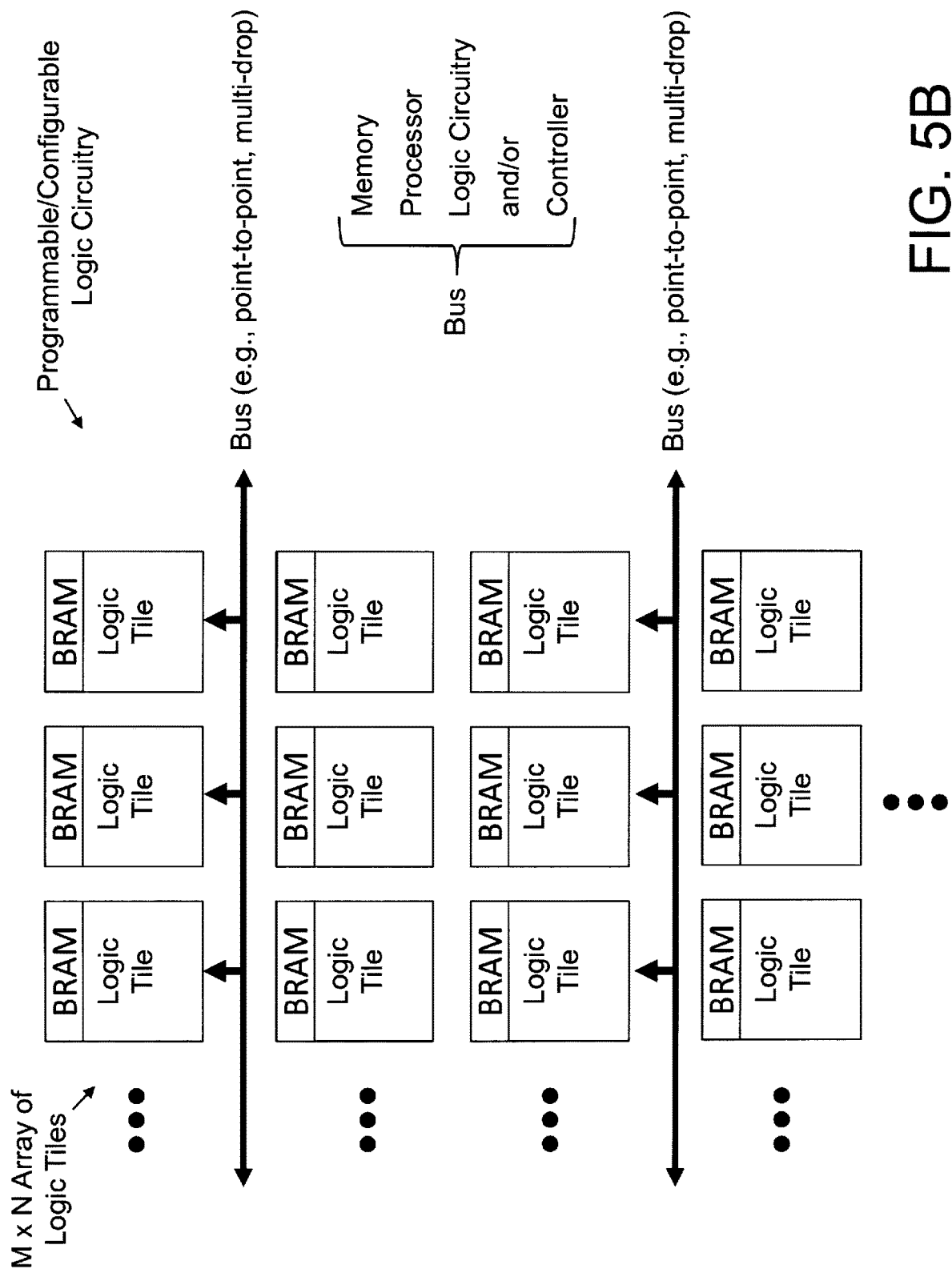
Figure 5C:
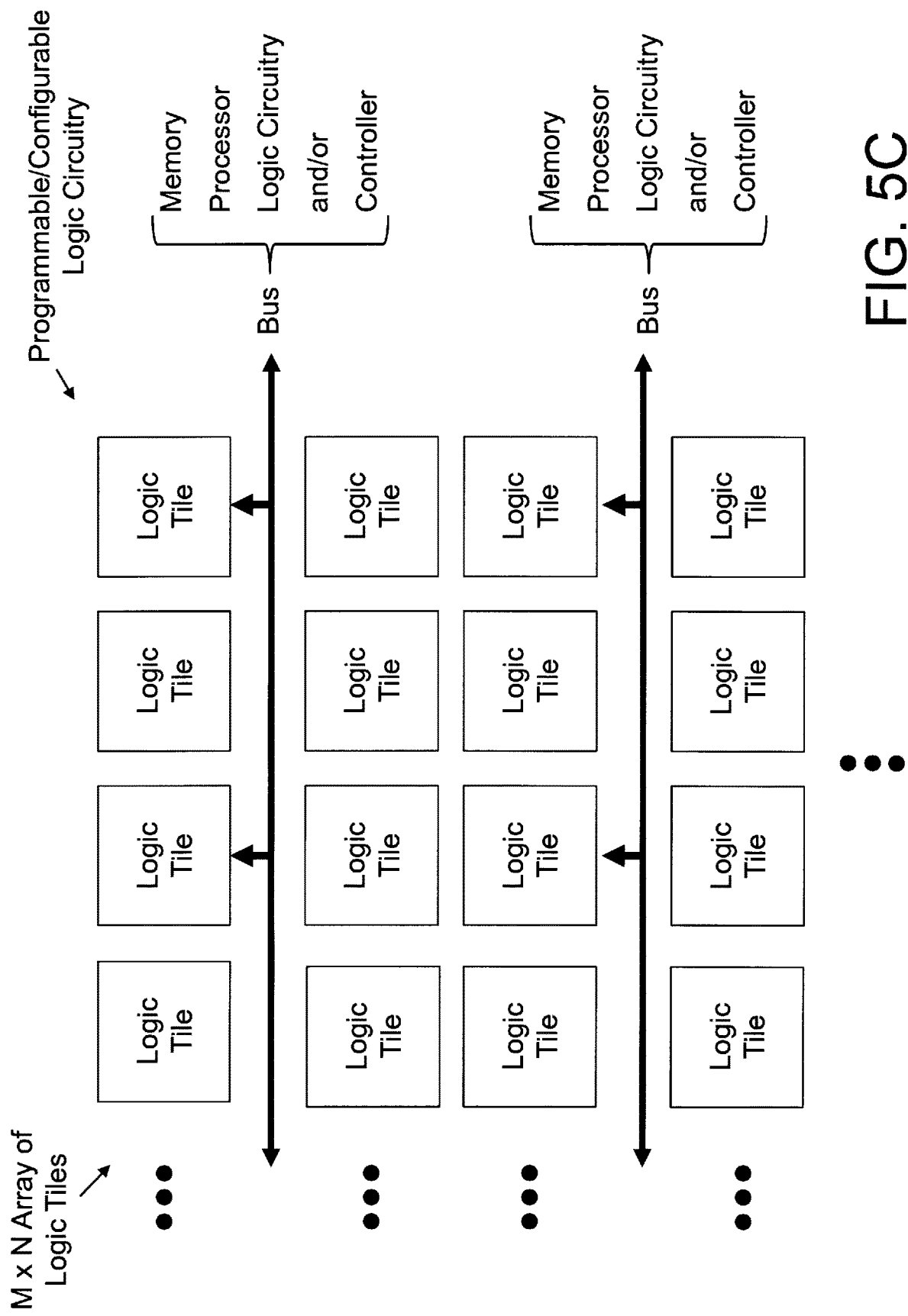
Figure 5D:
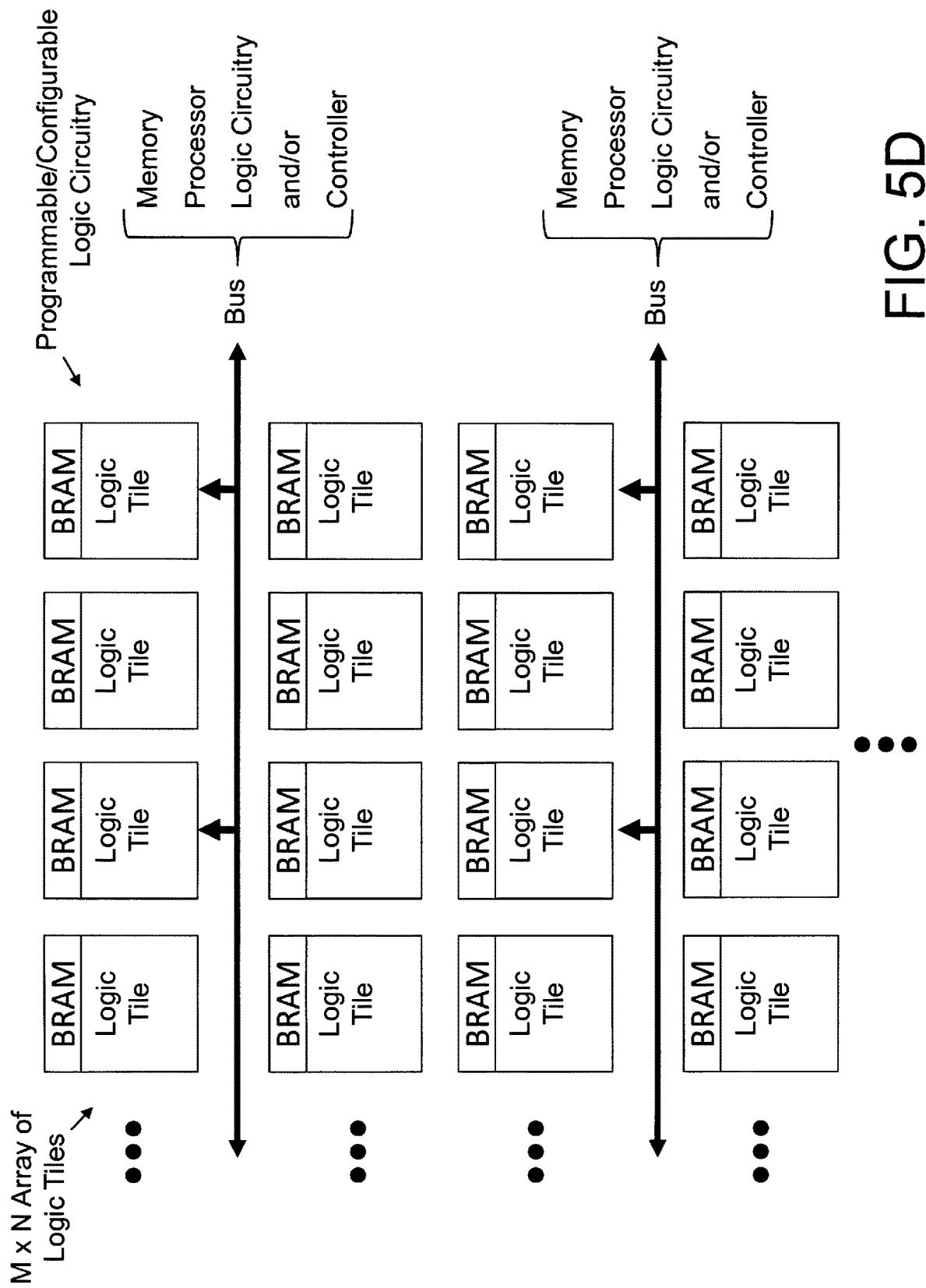
Figure 5E:
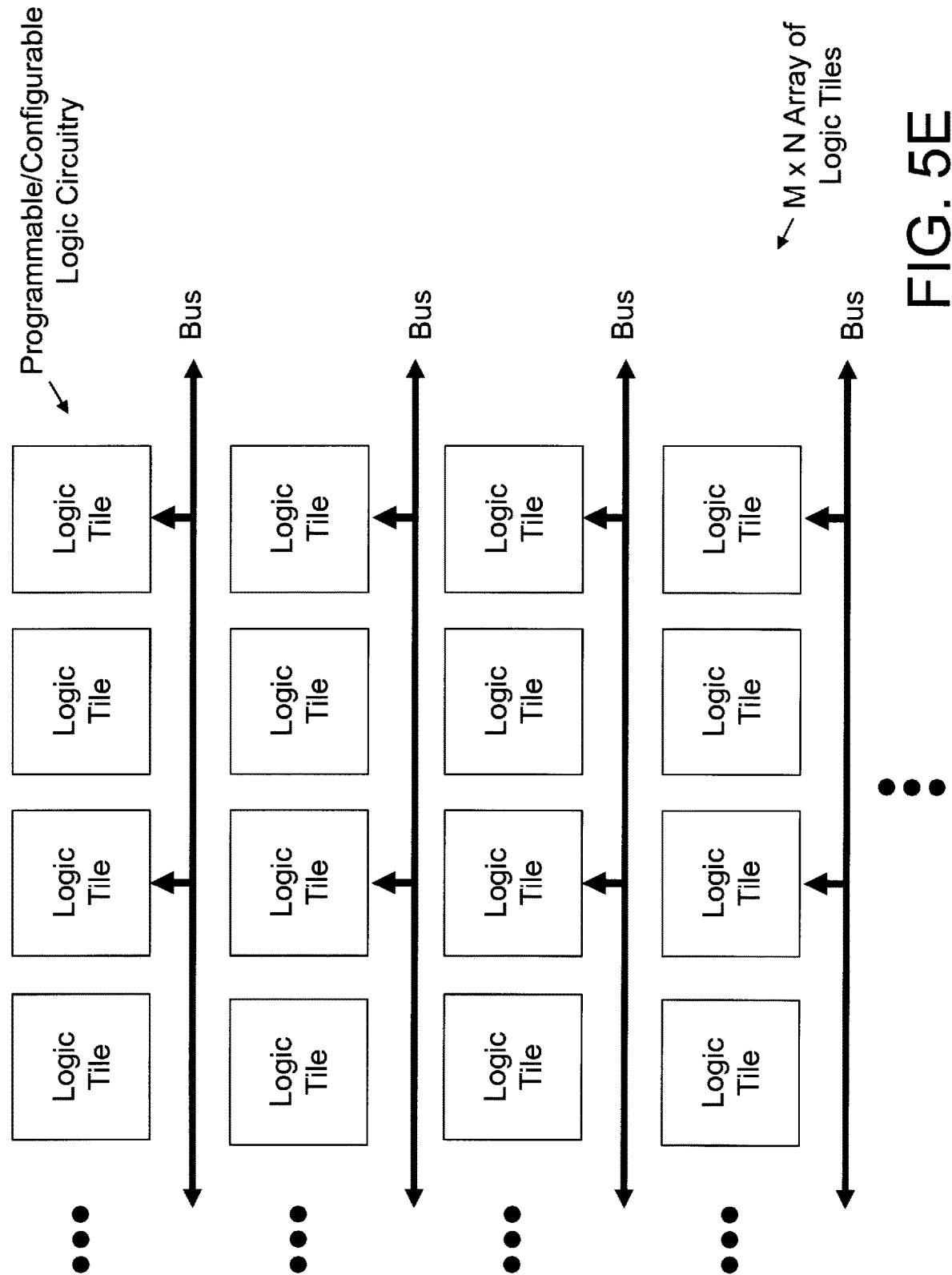
Figure 5F:
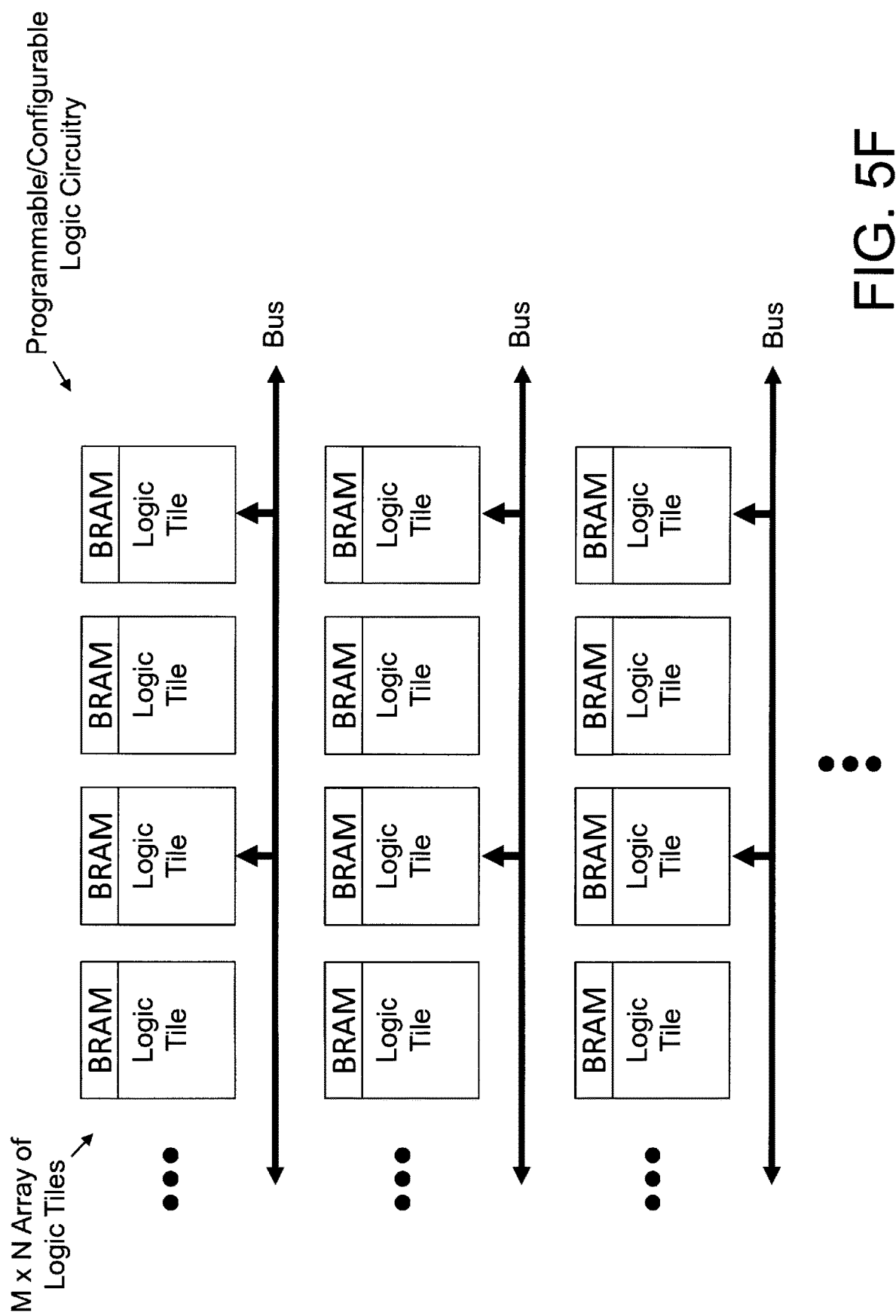
Figure 5G:
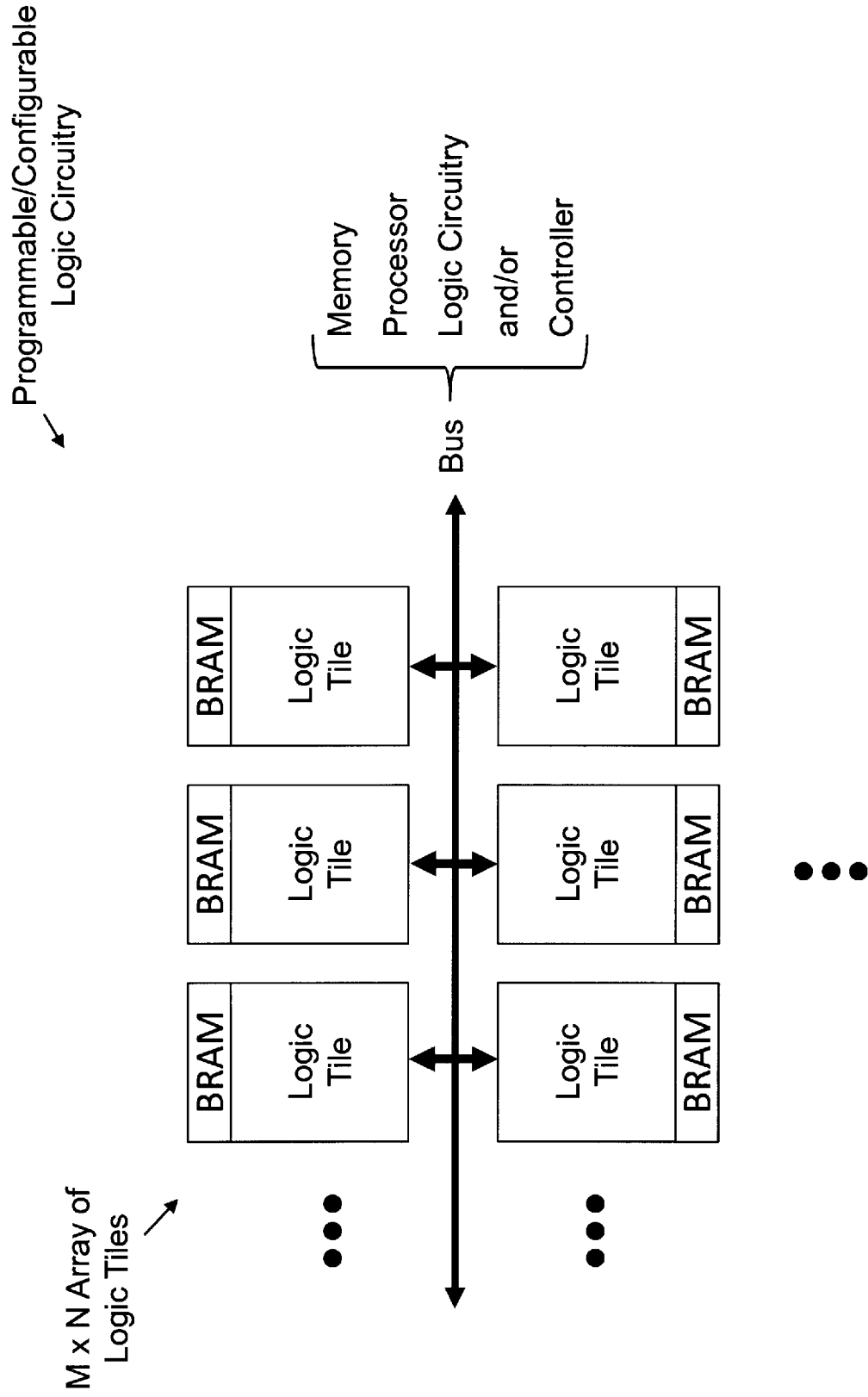
Figure 6A:
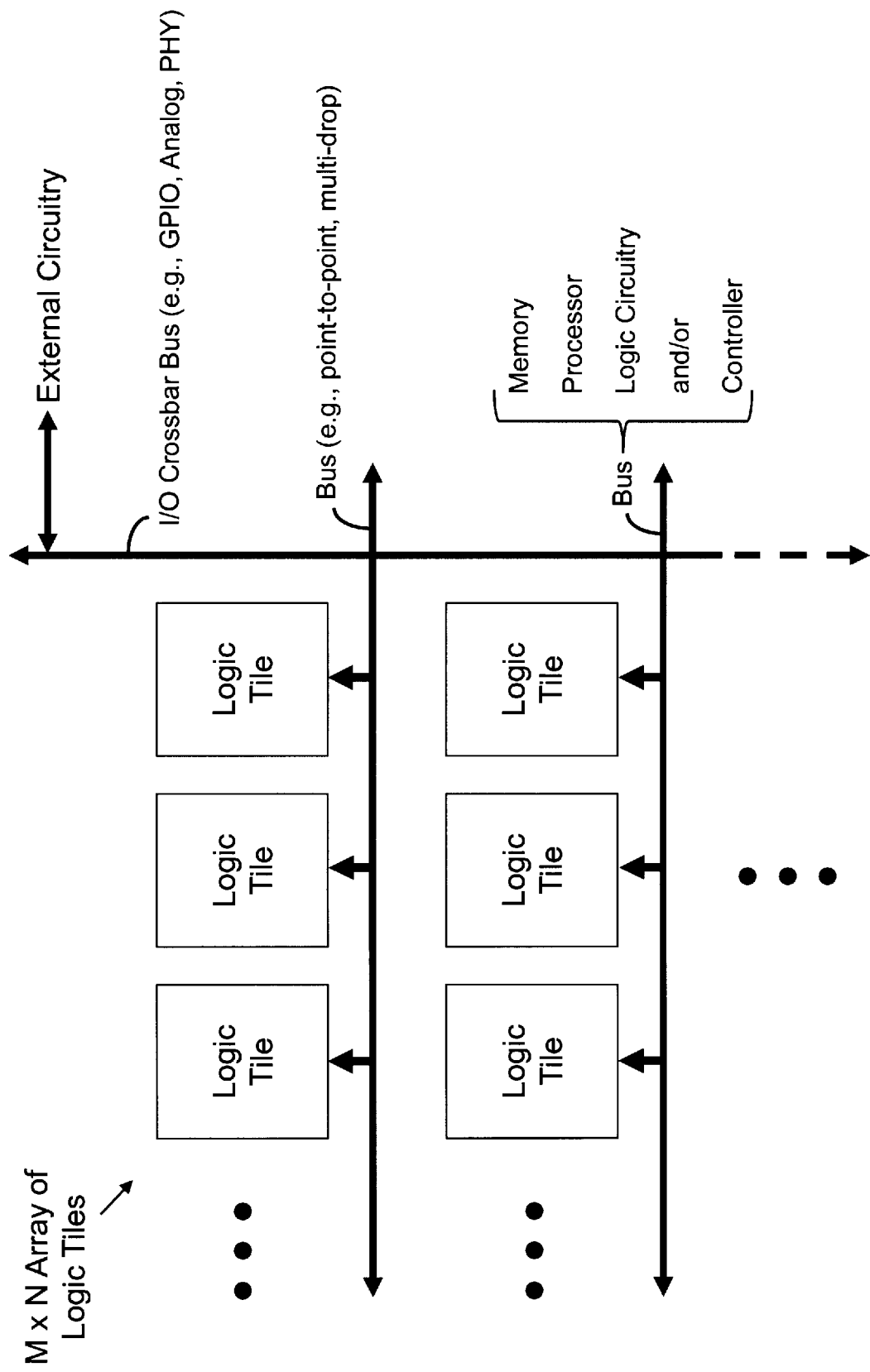
FIGS. 6A-6G illustrate, among other things, an exemplary layouts and architectures of the array of logic tiles relative to the bus, and the number of logic tiles connected to that bus, in accordance with certain aspects and/or embodiments of the present inventions, wherein in these embodiments an I/O crossbar bus may connect to one or more of the busses to access and/or communicate data to/from one or more logic tiles, one or more rows of logic tiles, one or more columns of logic tiles and/or all logic tiles of the programmable/configurable logic circuitry; the bus may connect to the I/O disposed on the perimeter or periphery of the logic tile that is adjacent to the bus and, in one embodiment, to the I/O on the perimeter of the logic tile which is interior to the periphery of the programmable/configurable logic circuitry (see, e.g., FIGS. 1B, 1C and 1D); notably, all layouts, bus routing, and architectures are intended to fall within the scope of the present inventions; here, I/O crossbar bus is, for example, a general purpose I/O bus (employing a GPIO type or a proprietary signaling protocol), analog (implementing, for example, an analog signaling protocol) or PHYs (employing, for example, an Ethernet or USB type signaling protocol); in one embodiment, the I/O crossbar bus may connect to external circuitry to facilitate user, operator or control circuitry communication (e.g., directly) with one, some or all of the logic tiles via the I/O crossbar bus. In addition thereto, or in lieu thereof, the I/O crossbar bus may communicate (e.g., directly) with one, some or all of the memory arrays in the programmable/configurable logic circuitry (e.g., one, some or all of the memory arrays that are associated with the logic tiles); as noted above, the BRAM may be one port or two/dual port memory such that the memory is accessible via the bus as well as circuitry of the logic tile (see, e.g., FIGS. 6C and 6D)
Figure 6B:
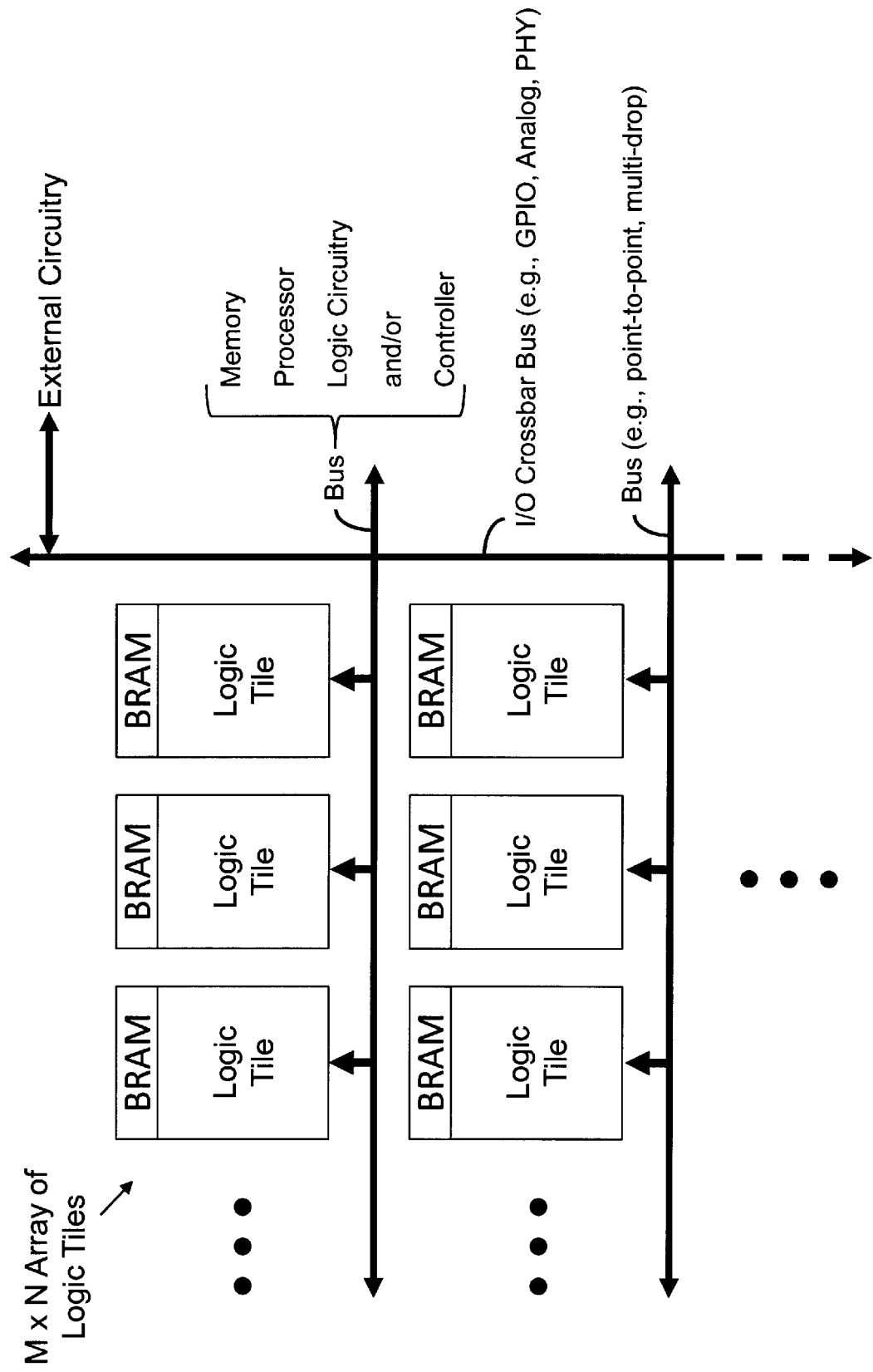
Figure 6C:
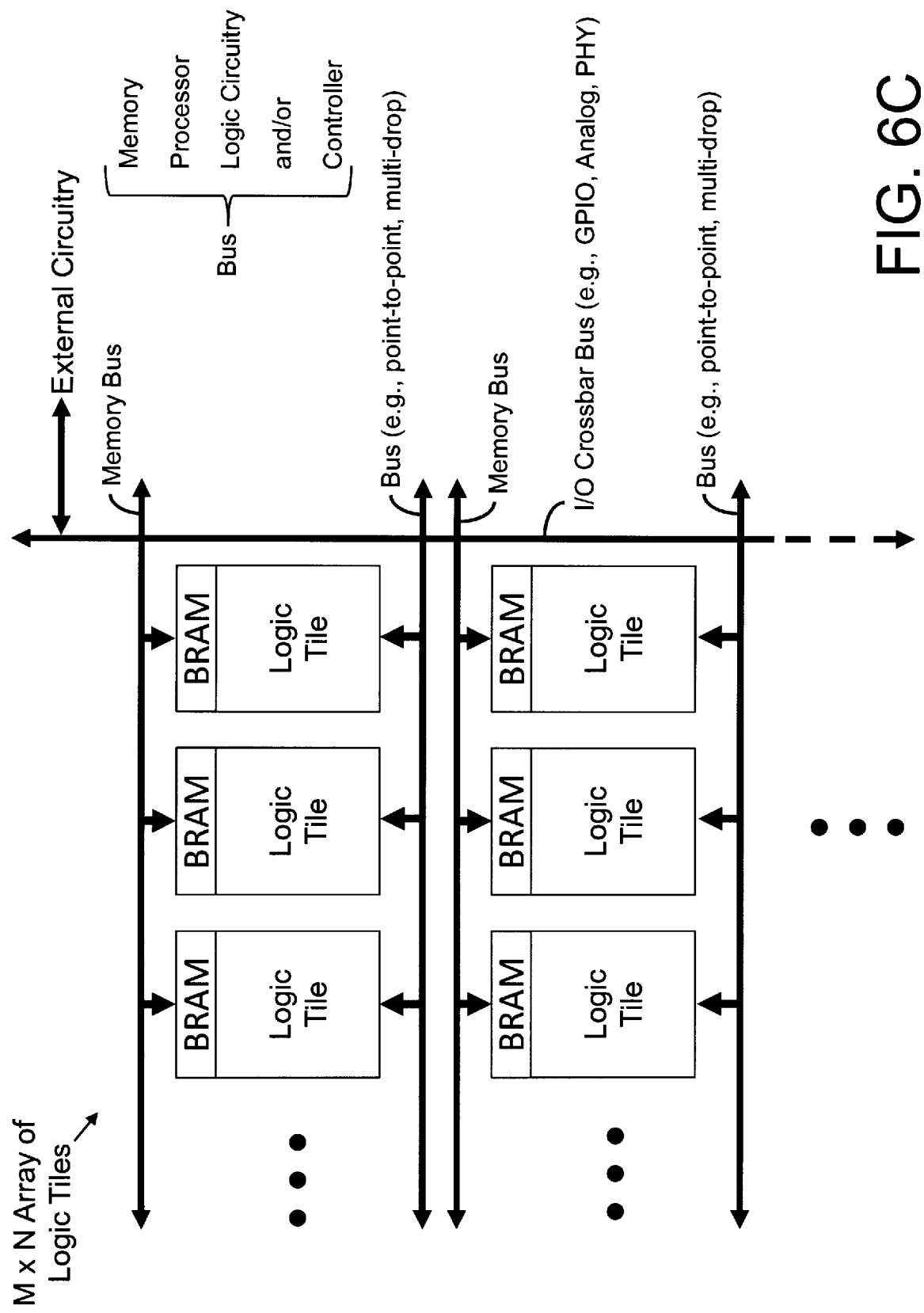
Figure 6D:
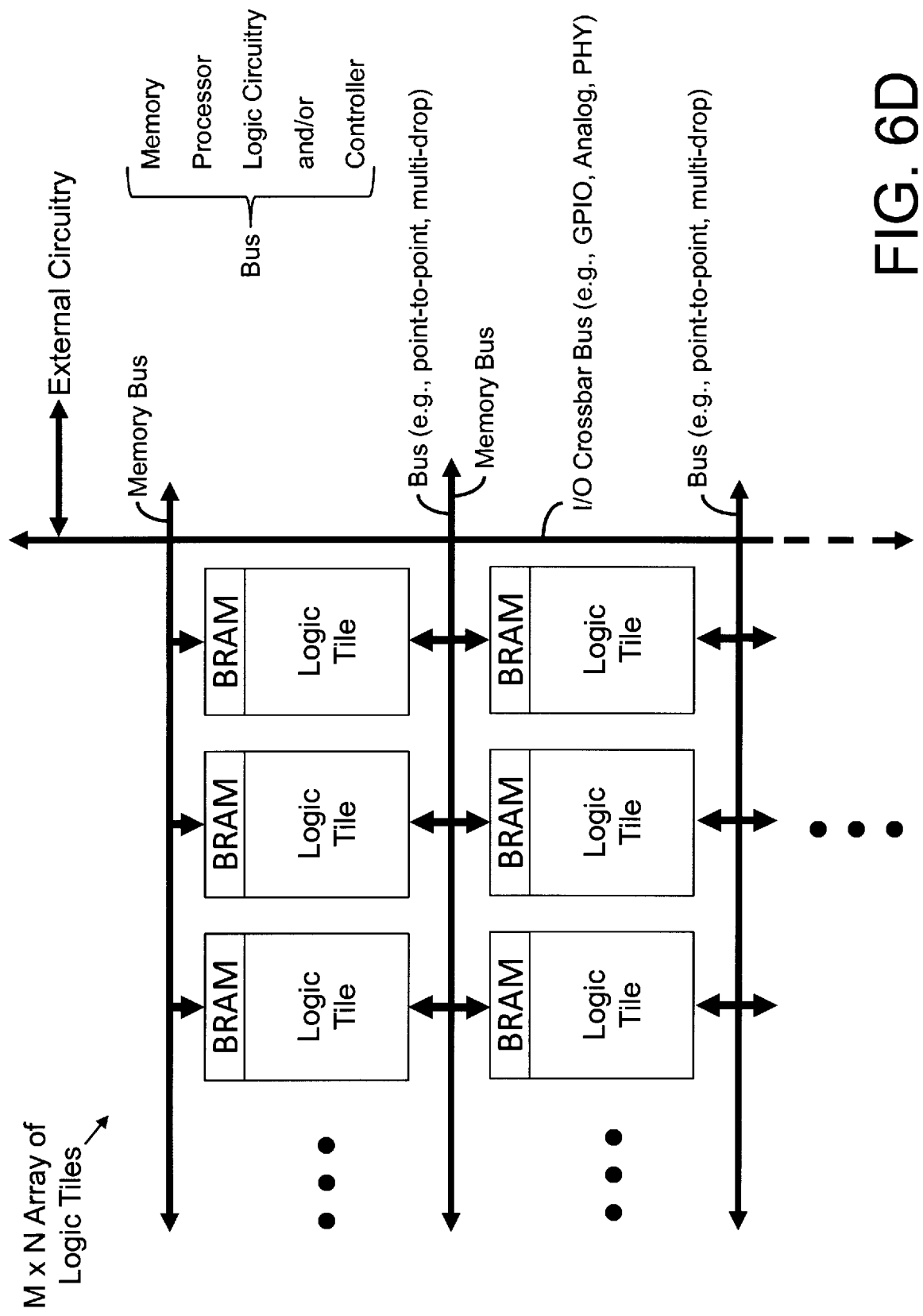
Figure 6E:
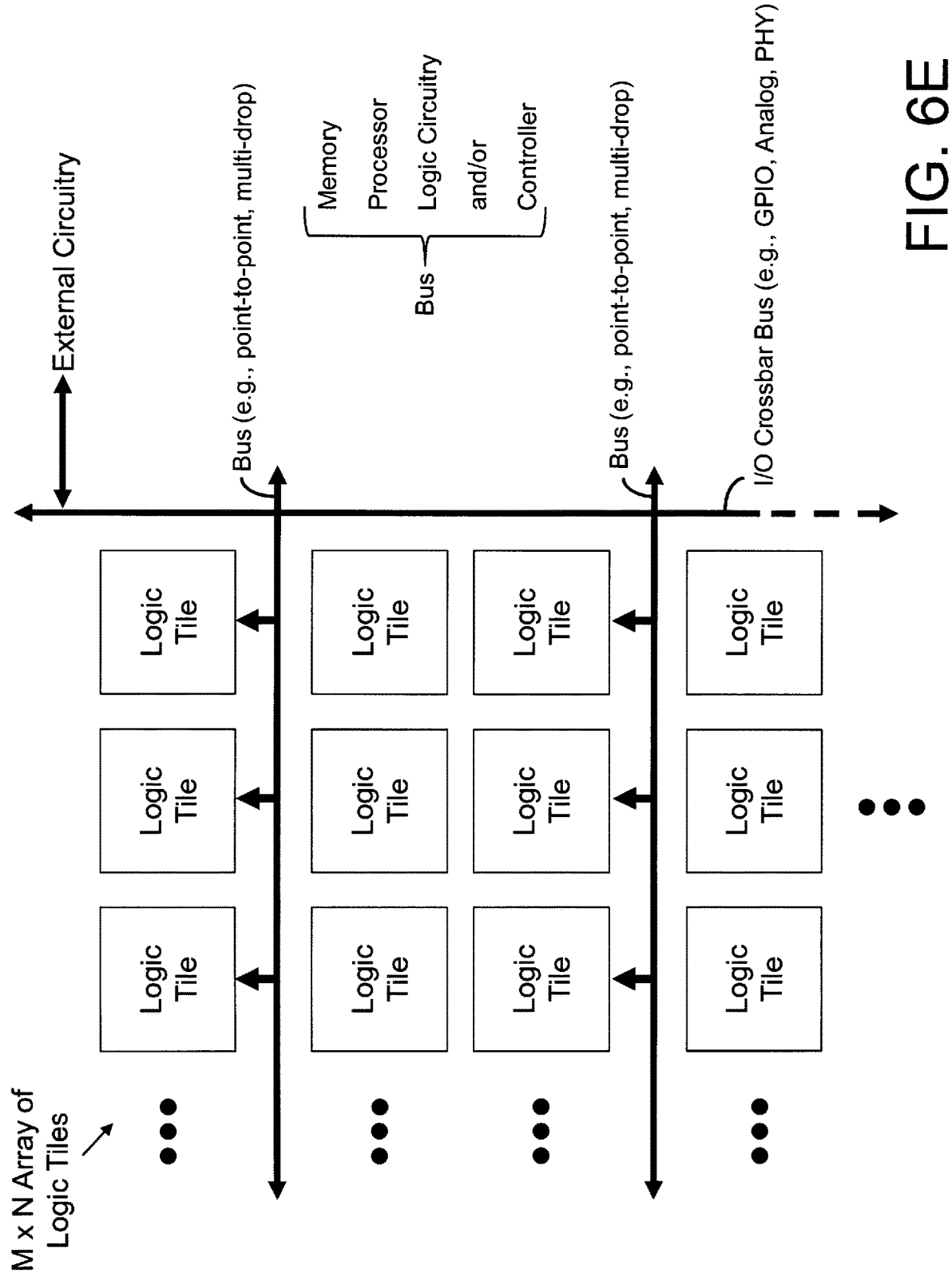
Figure 6F:
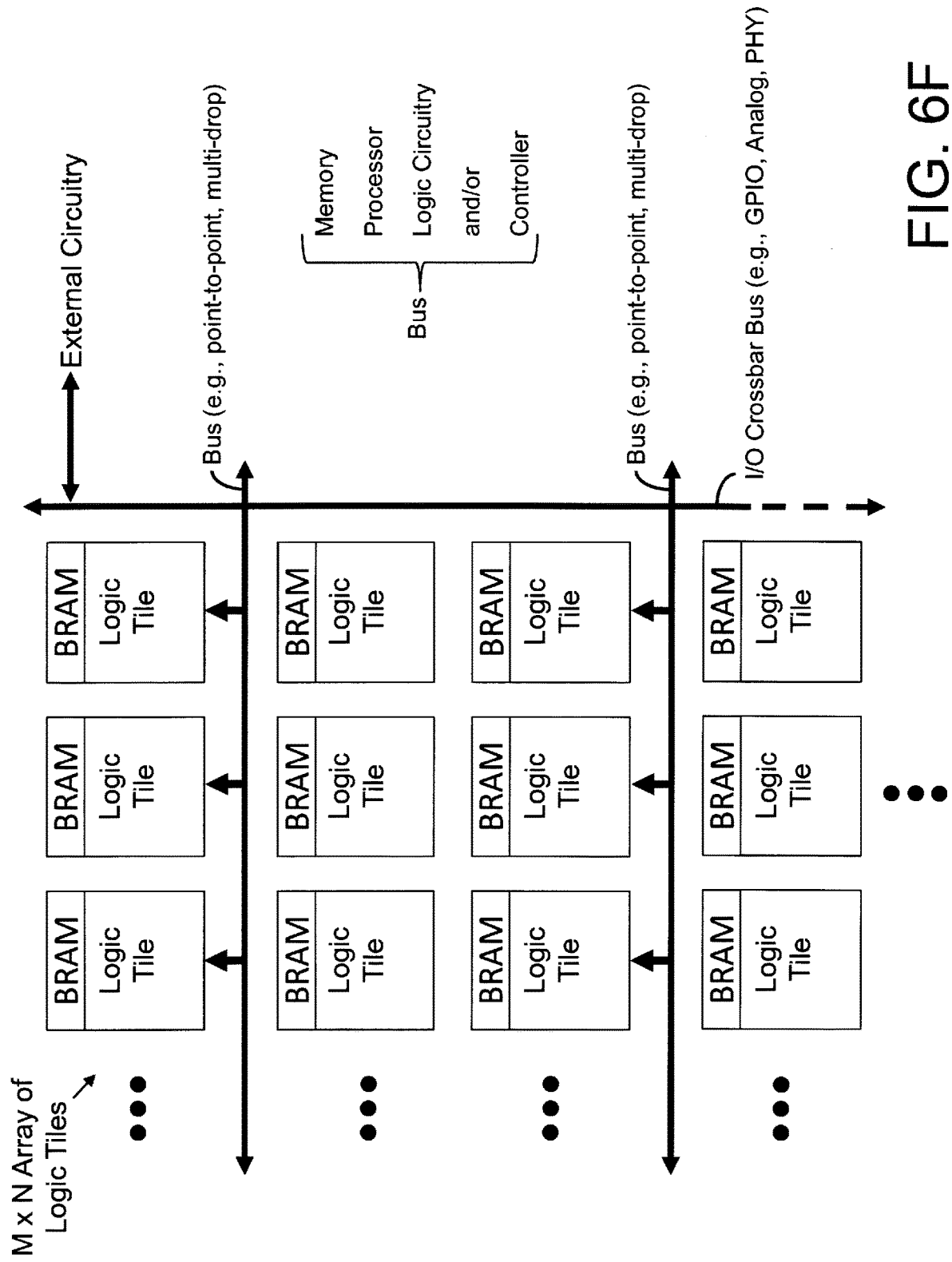
Figure 6G:
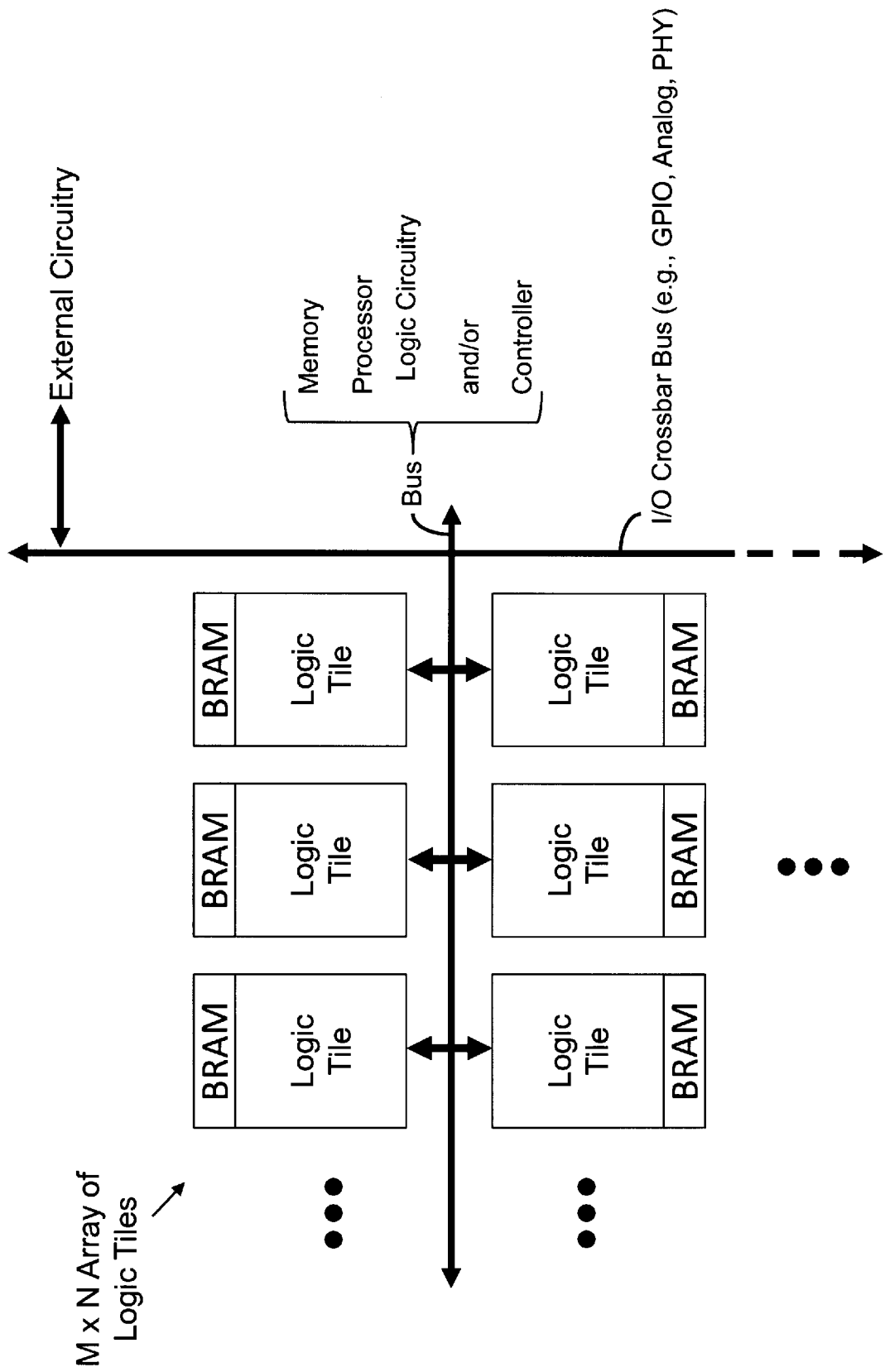

Further, although the array of logic tiles is illustrated as including identical logic tiles, in certain embodiments, all of the logic tiles of the array may not be identical—for example, in relation to the circuitry or contents therein. For example, in one embodiment, certain logic tiles may include logic and memory (L/M) whereas other logic tiles may include digital signal processing (DSP) cores. In one layout embodiment, the rows of array of logic tiles alternate between a row of logic/memory tiles (L/M) and a row of DSP tiles. (See, for example, FIG. 4 wherein an L/M Tile is a logic/memory tile and DSP Tile is digital signal processing core tile). In another embodiment, the array of logic tiles alternate between two contiguous rows of logic/memory tiles and one row of DSP tiles. In yet another embodiment, each row (and/or column) the logic tiles includes alternating logic/memory tiles and DSP tiles. Notably, all combinations and permutations of logic/memory tiles and DSP tiles are intended to fall within the scope of the present inventions.

Certain aspects of the present inventions will be explained in connection with the exemplary embodiment of the 3×3 array of logic tiles illustrated in FIGS. 3A and 3B. The 3×3 array is employed for illustrative purposes only in order to describe aspects of the present inventions. The physical array of logic tiles may be any size (row or column) and/or shape (i.e., row vs. column).

Figure 3A:
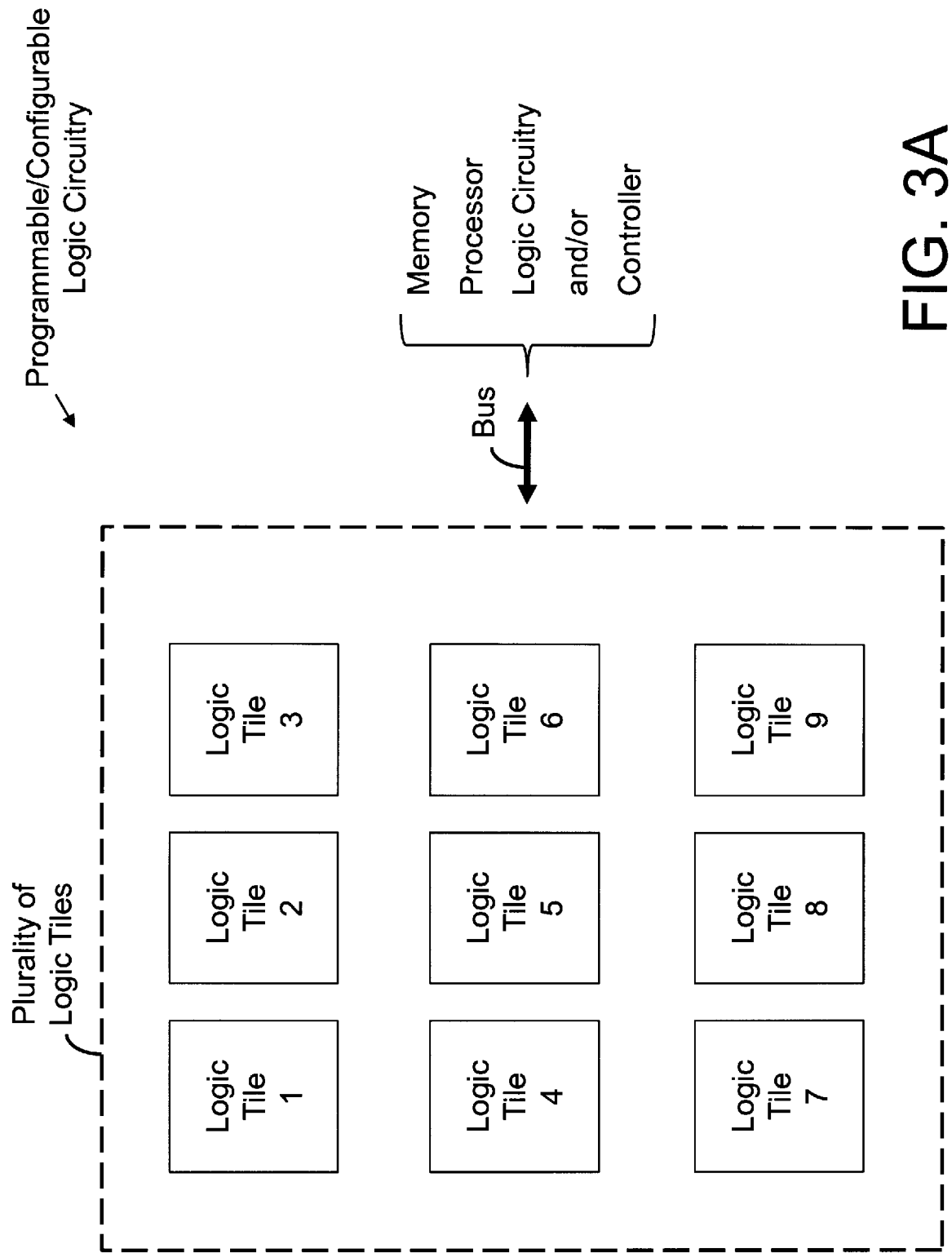
FIGS. 3A and 3B illustrate, among other things, an exemplary block diagram representation of a modular computing logic tile array architecture, according to certain embodiments of the present inventions, wherein, in this exemplary embodiment, the logic tile array is comprised of a 3×3 array; notably, in one embodiment, BRAM is associated with one, some or all of the logic tiles; the bus(es) (e.g., point-to-point and/or multi-drop architectures) provide communication between memory (e.g., external to the array of logic tiles), a processor, logic circuitry and/or a controller to facilitate, for example, configuration, re-configuration, programming, or re-programming of the logic tile(s), and operation(s) or function(s) performed thereby, of the modular computing logic tile array; that is, in one embodiment, the bus(es) facilitate communication of data, address and/or control signals (e.g., directly) to one or more (or all) of the logic tiles (e.g., FIGS. 2B-2D) and/or BRAM (block random access memory) associated therewith via direct connection between the logic tile (and/or BRAM associated therewith) and memory (e.g., external to the array of logic tiles), a processor, logic circuitry and/or a controller, in accordance with certain aspects and/or embodiments of the present inventions.
Figure 3B:
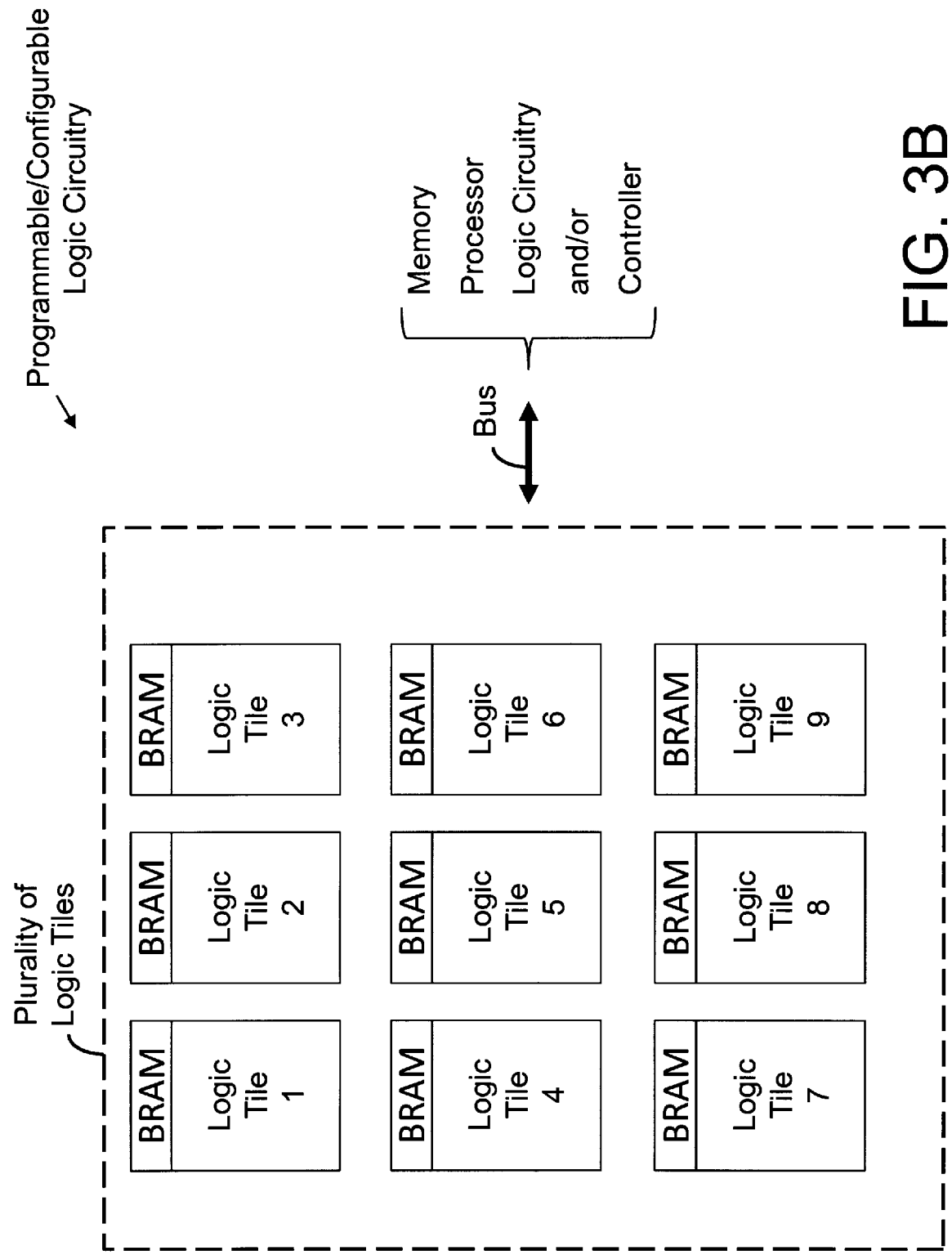

With that in mind, with reference to FIGS. 3A and 3B, in one embodiment, the modular computing logic tile array architecture of the present inventions may be programmed or configured (e.g., programmed immediately after initialization) to include a plurality of groups (or all of the groups) of logic tiles, wherein each group may be programmed or configured to (i) perform or implement one or more functions or operations as well as (ii) directly interface or communicate with one or more busses (e.g., Advanced eXtensible Interface (AXI) or Network on Chip (NoC) type buses) that connect to circuitry external to the logic tile array (e.g., a processor, controller or NoC master). Here, the one or more busses may communicate data, address and/or control signals directly to one or more logic tiles of the array (e.g., one or more logic tiles that are on the periphery of the array and/or are entirely internal to the periphery of the array). As described above, the bus may directly connect to the I/O disposed on the perimeter or periphery of the logic tile that is adjacent to the bus; and, in one embodiment, to the I/O on the perimeter of the logic tile which is interior to the periphery of the programmable/configurable logic circuitry (see, e.g., FIGS. 1B-1D, and FIGS. 3A and 3B). In one embodiment, the one or more buses (e.g., Advanced eXtensible Interface (AXI) or Network on Chip (NoC) type buses) provide a common interface to the logic tiles for different functions or operations performed or implemented by each logic tile (or each group of logic tiles), the logic tiles may send and/or receive data to/from other circuitry—whether incorporated or implemented on other logic tiles, or outside the FPGA boundary, such as a processor or a NoC master.

In one embodiment, a plurality of logic tiles (e.g., all) and/or each group of logic tiles has access to and may communicate, via a common and dedicated interface and signaling/communication protocol, with the same resources (e.g., memory (e.g., high-speed local RAM), one or more busses, and/or circuitry external to the array (e.g., a processor, a controller and/or system memory (i.e., memory which is external to the plurality of logic tiles))) to be (i) programmed, configured and/or re-configured to perform one or more functions or operations, and/or (ii) implement, execute and/or perform one or more functions or operations. As such, in one embodiment, the resources are dedicated to each modular FPGA and access through the dedicated interfaces does not impact other modules accessing their similarly dedicated resources. Here, any of the logic tiles may be assigned or allocated to any group of logic tiles. Moreover, a logic tile and/or any group of logic tiles may be programmed, configured and/or re-configured in a uniform, consistent and/or the same manner regardless of logic tile and/or group of logic tiles. In this way, the plurality of logic tiles of the programmable/configurable logic circuitry of the FPGA may implement a modular computing architecture.

The common interface (and, in one embodiment, a common and dedicated interface) of the plurality of logic tiles and/or each group of logic tiles provides a function-agnostic method of performing data transfer/communication, regardless of which function(s) or operation(s) the logic tile(s) are performing or to perform. Moreover, the one or more buses may also facilitate, among other things, communication of configuration and/or re-configuration data to the logic tiles to implement the modular computing array architecture of the present inventions. For example, the bus may be coupled to memory that stores data which is employed to configure or program the logic tiles to implement the predetermined function(s) or operation(s). Indeed, in one embodiment, code (e.g., RTL, Verilog/VHDL or the like), which is employed to configure or program the logic tiles to perform a specific operation or function, may be stored in memory coupled to the bus and available to configure and/or re-configure circuitry in one or more (or all) of the logic tiles. In one embodiment, the code is read from the memory and applied to the logic tiles of the group to implement a predetermined function or operation. In this way, the logic tiles of the group are configured or programmed (or re-configured or re-programmed) to perform the function/operation defined by the code. The logic tiles may be grouped and re-grouped during or after initialization to perform any functions or operations now known or later developed including, for example, digital signal processing, encoding, decoding, encrypting, decrypting and/or other forms of data manipulation. Indeed, the present inventions may employ any of the inventions described and/or illustrated in U.S. patent application Ser. No. 15/975,037, entitled "FPGA having a Virtual Array of Logic Tiles, and Method of Configuring and Operating Same." The contents of the '037 application are incorporated herein by reference in its entirety.

For example, with continued reference to FIGS. 3A and 3B, in one embodiment, the modular computing logic tile array architecture of the present inventions may be programmed or configured (e.g., programmed immediately after initialization) to include a first group of logic tiles consisting of a 1×1 array (e.g., Logic Tile 1) to perform a first operation/function, a second group of logic tiles consisting of a 2×1 array (e.g., Logic Tiles 4 and 7) to perform a second operation/function, a third group of logic tiles consisting of a 2×2 array (e.g., Logic Tiles 2, 3, 5 and 6) to perform a third operation/function, and a fourth group of logic tiles consisting of a 1×2 array (e.g., Logic Tiles 8 and 9) to perform a fourth operation/function. Upon completion of the third operation/function by the third group of logic tiles (and while one or more of the other operations/functions are still in process or being executed), the third group of logic tiles (or a portion thereof—e.g., Logic Tiles 5 and 6) may be re-configured or re-programmed to perform a different operation/function.

Alternatively, the re-configuration or re-programming may include logic tiles of the third and fourth groups (or portions thereof). For example, (i) Logic Tiles 2 and 3 may be re-configured or re-programmed as a group to perform a fifth operation/function, (ii) Logic tiles 5 and 6 may be re-configured or re-programmed as a group to perform a sixth operation/function (iii) Logic Tile 9 may be re-configured or re-programmed as a group to perform a seventh operation/function. Here again, each group of logic tiles may operate independently of/from one or more (or all) of the other groups of logic tiles.

The number of logic tiles allocated to or in a group may depend on the particular operation or function to be implemented. Certain operations or functions require or dictate use of more or less logic tiles to perform. That is, the amount or size of the code (e.g., RTL, Verilog/VHDL or the like) employed to configure or program the logic tiles to implement the predetermined function or operation may dictate the number of logic tiles allocated or assigned to the group which is configured or programmed to implement the function or operation. In one embodiment, the code (e.g., RTL, Verilog/VHDL or the like) is provided to the logic tiles of the group via the bus (e.g., the point-to-point and/or multi-drop bus). Upon receipt of the code, logic tiles of the group are configured or programmed to perform the predetermined operation or function.

For example, in one embodiment, based on currently available RTL: (i) a 256FFT operations or functions may be implemented via six logic tiles in the group (e.g., an A×B array of six logic tiles), (ii) JPEG encoding operations or functions may be implemented via eight logic tiles in a group (e.g., an A×B array of eight logic tiles), (iii) SHA-256 cryptographic operations or functions may be implemented via one logic tile (i.e., a 1×1 array of logic tiles), and (iv) AES-128 cryptographic operations or functions may also be implemented via one logic tile (again, a 1×1 array of logic tiles). The number of logic tiles set forth herein to employ a particular operation or function is merely exemplary. Moreover, other factors or characteristics of the operation/function implementation (e.g., throughput) may suggest, necessitate, require or dictate employing more or less logic tiles.

It should be noted that the size of the array of logic tiles of the group allocated to perform a given operation or function may be referenced as a "re-configurable code container". The size of the "re-configurable code container" may determine which logic tiles of the M×N array of logic tiles, and where within that array, are configured or re-configured to implement, execute or perform the operation or function associated with the re-configurable code mode. With that in mind, a 1×1 "re-configurable code container" may be implemented in any location in the array of logic tiles and, in addition, may be implemented in any size M×N array of logic tiles. However, a 3×3 "re-configurable code container" requires nine logic tiles to implement and the location of such a group is more limited.

As noted above, in one embodiment, the bus is employed to connect the logic tiles to memory that stores data which is representative of code (e.g., RTL, Verilog/VHDL or the like) that is written into the logic tile(s) associated with the group that is configured, defined or allocated to implement the predetermined function(s) or operation(s) (e.g., digital signal processing, an accelerator, data encryption, data decryption, a filter, an encoder, a decoder, data compression, data decompression, network stack, and/or a state machine). In operation, the data may be read from, for example, memory (e.g., memory external to the array of logic tiles) and applied, executed and implemented in the logic tile(s) of the group of logic tile(s) designated or employed to implement or execute the specific function or operation corresponding to the data. Once such data is written to and implemented in the BRAM (which may over-write earlier data), the logic tile may be configured/re-configured or programmed/re-programmed to thereby implement the modular computing array architecture of the present inventions.

Notably, while each group of logic tiles may operate independently, the performance of an operation or function by one group may rely on the performance of an operation or function performed by another group. For example, a group of logic tiles performing a first operation/function (for example, data compression) may retrieve data from memory (via the bus) perform a data compression operation thereon and store the compressed data back in memory. Thereafter (or in parallel therewith), another group of logic tiles performing a second operation/function (for example, data encryption) may retrieve (via the bus) compressed data (after compression via the first group of logic tiles), encrypt that compressed data, and thereafter store the encrypted compressed data back in memory.

With continued reference to FIGS. 3A and 3B, when a group of logic tiles completes the operation/function and/or a new group of logic tiles is necessary to perform a function or operation, control circuitry (for example, processor or controller) may re-configure or re-program portions of the logic tile array to implement such function or operation. Here, the group may notify the control circuitry that it has completed or terminated its configured or programmed function or operation. The control circuitry, after receipt of a completion or termination data/signal, may re-configure the logic tiles into one or more different groups by accessing the memory, via the bus, that stores the code (e.g., RTL, Verilog/VHDL or the like) and re-configuring the array into a group to execute the new/different operation or function.

As indicted above, in one embodiment, memory external to the array stores the code used to configure or program the logic tile. The "new" code may be written into each logic tile of the new group of logic tiles (e.g., overwriting the "old" code associated with the previous group of logic tiles) to execute the re-configuration or re-programming operation (e.g., reconfigure the interconnect network (e.g., the network pertaining to the internal connections/conductors and/or the network pertaining to the logic tile to logic tile connections/conductors) and/or logic circuitry in one or more or all of the logic tiles of the group). Such "new" code is employed to configure or program the logic tiles of the "new" group which is necessary or used to implement a function or operation (or new function or operation) and thereby implement the modular computing array architecture of the present inventions. Notably, in certain embodiments, "new" code may not be written into each logic tile of the group of logic tiles—but only into certain of those logic tiles that require "new" code for the re-configuring or re-programming operation.

Again, although FIGS. 3A and 3B illustrate a 3×3 array of logic tiles, the array of logic tiles may be any size of shape (rows relative to columns). Moreover, each group of logic tiles configured or defined to implement one or more (or all) unique or non-unique functions or operations. Indeed, although many of the embodiments describe a group of logic tiles as programmed, configured or defined to implement or perform a function, such function may be a singular function/operation or a plurality of related or unrelated functions/operations (for example, a combination of related functions/operations).

With reference to FIGS. 2B, 2C and 5A-5G, the layout and architecture of the array of logic tiles relative to the bus, and the number of logic tiles connected to that bus, may determine the granularity of the array size of the groups as well as the available size that may be allocated to implement a given "re-configurable code container". For example, the layout and architecture illustrated in FIGS. 2B and 2C provide a 1×1 granularity of logic tiles given that each logic tile of the array is connected to the bus to receive a code to implement an operation or function. Here, a 1×1 "re-configurable code container" may be located in any location the M×N array of logic tiles. The granularity of logic tiles may be different where, for example, every second logic tile and/or every second row of logic tiles is connected to the bus (e.g., AXI bus). (See, for example, FIGS. 5A-5F). The granularity of the bus connections can also be changed by configuring the function of the logic tiles to enable and disable certain connected busses (for example, the logic tiles in FIG. 5E can be executing a 4×4 array where only the lower-right bus connection is enabled, and the other 7 bus connections are disabled, by configuration). Other layouts and architectures may be implemented, via modifying the logic tile layout relative to the bus or bus routing, to maintain a 1×1 granularity while managing or reducing the size of the array (relative to other architectures/layouts). (See, FIG. 5G). All layouts, bus routing, and architectures are intended to fall within the scope of the present inventions. Moreover, as described above, the bus may directly connect to the I/O disposed on the perimeter or periphery of the logic tile that is adjacent to the bus; and, in one embodiment, to the I/O on the perimeter of the logic tile which is interior to the periphery of the programmable/configurable logic circuitry (see, e.g., FIGS. 1B-1D, and FIGS. 5A-5F).

Notably, in one embodiment, each logic tile of the programmable/configurable logic circuitry further includes a plurality of multiplexers which are electrically interconnected into a network (for example, a hierarchical network and/or mesh, torus or the like interconnect network (hereinafter collectively "mesh network")). Exemplary interconnect networks are set forth in U.S. Pat. No. 9,503,092, which is incorporated herein by reference in its entirety. In one embodiment, the logic tiles are interconnected to other logic tiles of the array via a configurable mesh network, for example, as implemented in a manner described and illustrated in U.S. Pat. No. 9,503,092. Indeed, in one embodiment, the highest stage of the mixed-mode switch interconnect architecture is a mesh interconnect (here, a plurality of switch matrices of the highest stage of a logic tile is connected to one or more of the switch matrices of that stage in that logic tile and one or more switch matrices of the highest stage (i.e., mesh stage) in at least one other logic tile). The lower stages of network/interconnect in each logic tile may implement a hierarchical network; this notwithstanding, another mesh network/stage may be implemented as a substitute and replacement of one or more of the hierarchical network of the lower stages.

In another embodiment, the FPGA of the present inventions may employ the architectures described and/or illustrated in U.S. patent application Ser. No. 15/239,958 wherein memory (e.g., dual port memory) is disposed between and adjacent to the logic tiles. The logic tiles, via memory I/O, connect to the memory to facilitate communication (read and/or write of data to/from the memory from/to the adjacent logic as described and illustrated in U.S. patent application Ser. No. 15/239,958, which is hereby incorporated by reference herein in its entirety). Such memory may store configuration or programming code as well as function as a scratch-pad like memory during performance of the operation/function associated to the logic tile(s).

There are many inventions described and illustrated herein. While certain embodiments, features, attributes and advantages of the inventions have been described and illustrated, it should be understood that many others, as well as different and/or similar embodiments, features, attributes and advantages of the present inventions, are apparent from the description and illustrations. As such, the embodiments, features, attributes and advantages of the inventions described and illustrated herein are not exhaustive and it should be understood that such other, similar, as well as different, embodiments, features, attributes and advantages of the present inventions are within the scope of the present inventions.

Indeed, the present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof.

For example, the modular FPGA may also include an I/O crossbar bus that may connect to one or more of the busses to access and/or communicate data to/from one or more logic tiles, one or more rows of logic tiles, one or more columns of logic tiles and/or all logic tiles of the programmable/configurable logic circuitry. (See, for example, FIGS. 6A-6G). In one embodiment, the I/O crossbar bus is, for example, a general purpose I/O bus (employing a GPIO type or a proprietary signaling protocol), analog (implementing, for example, an analog signaling protocol) or PHYs (employing, for example, an Ethernet or USB type signaling protocol). The I/O crossbar bus may connect to external circuitry to facilitate user, operator or control circuitry communication (e.g., directly) with one, some or all of the logic tiles via the I/O crossbar bus. In addition thereto, or in lieu thereof, the I/O crossbar bus may communicate (e.g., directly) with one, some or all of the memory arrays in the programmable/configurable logic circuitry (e.g., one, some or all of the memory arrays that are associated with the logic tiles). Notably, the I/O crossbar bus may be implemented in any of the embodiments described and illustrated herein. For the sake of brevity, the discussion and/or illustration of the I/O crossbar bus in conjunction or connection with all embodiments is not specifically and individually provided.

The modular FPGA, bus and processor, controller, logic circuitry, state machine and/or system-on-chip (SoC) may be disposed or manufactured on, or integrated in the same die or a separate die. (See, FIGS. 7A-7C). Where the FPGA and processor, controller, logic circuitry, state machine and/or SoC are fabricated on or integrated in a single die, the FPGA may be embedded. Here, the FPGA (e.g., one or more (or all) of the logic tiles and/or associated BRAM) and circuitry of, for example, a processor or SoC, may communicate via the bus in any manner as described and/or illustrated in any of the embodiments set forth herein. Where the FPGA and processor, controller, logic circuitry, state machine and/or SoC are fabricated on or integrated in separate dice, the dice may be arranged in a co-planar architecture or a stacked architecture (see FIGS. 7B and 7C, respectively). Here again, the bus provides a communication path between the FPGA (including the plurality of logic tiles and/or associated BRAM) and circuitry of, for example, a processor or controller, in any manner as described and/or illustrated in any of the embodiments set forth herein.

In addition, each the group of logic tiles (which are configured or programmed to perform one or more operations or functions) of the present inventions may operate (partially or fully) dependently or independently from one or more (or all) of the other groups of logic tiles of the FPGA. Notably, all combinations and permutations of independent and dependent operation for each of the groups of logic tiles are intended to fall within the scope of the present inventions.

Further, the groups of logic tiles of the modular computing array may be programmed, configured or defined to implement any function/operation now known or later developed. For example, in one embodiment, a first group of logic tiles (which may include one or more logic tiles) may be programmed or configured as a data encryption engine or perform a first data encryption operations and a second group of logic tiles (which may include one or more logic tiles) may be programmed or configured as a data compression engine or perform data compression operations. Thereafter, certain logic tiles of the first group may be re-configured or re-programmed, while the FPGA is in operation (e.g., while the second group of logic tiles is implementing data compression operations on data (e.g., data provided by the bus), to perform a second/different data encryption operation, filter or an encoding operation. Indeed, in one embodiment, while the FPGA is still in operation—but after the second group of logic tiles has completed the data compression operations, the programmable/configurable logic circuitry may be re-configured or re-programmed such that certain logic tiles of the first group and certain logic tiles of the second group are re-configured or re-programmed into a third group of logic tiles to perform a third operation (e.g., an FFT operation).

Notably, various circuits, circuitry and techniques disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit, circuitry, layout and routing expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES and any other formats and/or languages now known or later developed. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

Indeed, when received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

Moreover, the various circuits, circuitry and techniques disclosed herein may be represented via simulations using computer aided design and/or testing tools. The simulation of the circuits, circuitry, layout and routing, and/or techniques implemented thereby, may be implemented by a computer system wherein characteristics and operations of such circuits, circuitry, layout and techniques implemented thereby, are imitated, replicated and/or predicted via a computer system. The present inventions are also directed to such simulations of the inventive circuits, circuitry and/or techniques implemented thereby, and, as such, are intended to fall within the scope of the present inventions. The computer-readable media corresponding to such simulations and/or testing tools are also intended to fall within the scope of the present inventions.

Notably, reference herein to "one embodiment" or "an embodiment" (or the like) means that a particular feature, structure, or characteristic described in connection with the embodiment may be included, employed and/or incorporated in one, some or all of the embodiments of the present inventions. The usages or appearances of the phrase "in one embodiment" or "in another embodiment" (or the like) in the specification are not referring to the same embodiment, nor are separate or alternative embodiments necessarily mutually exclusive of one or more other embodiments, nor limited to a single exclusive embodiment. The same applies to the term "implementation." The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated separately herein.

Further, as noted above, an embodiment or implementation described herein as "exemplary" is not to be construed as ideal, preferred or advantageous, for example, over other embodiments or implementations; rather, it is intended convey or indicate the embodiment or embodiments are example embodiment(s).

Although the present inventions have been described in certain specific aspects, many additional modifications and variations would be apparent to those skilled in the art. It is therefore to be understood that the present inventions may be practiced otherwise than specifically described without departing from the scope and spirit of the present inventions. Thus, embodiments of the present inventions should be considered in all respects as illustrative/exemplary and not restrictive.

Notably, the terms "comprises," "comprising," "includes," "including," "have," and "having" or any other variation thereof, are intended to cover a non-exclusive inclusion, such that a process, method, circuit, article, or apparatus that comprises a list of elements does not include only those elements but may include other elements not expressly listed or inherent to such process, method, article, or apparatus. Further, use of the terms "connect", "connected", "connecting" or "connection" throughout this document should be broadly interpreted to include direct or indirect (e.g., via one or more conductors and/or intermediate devices/elements (active or passive) and/or via inductive or capacitive coupling)) unless intended otherwise (e.g., use of the terms "directly connect" or "directly connected").

The terms "first," "second," and the like, herein do not denote any order, quantity, or importance, but rather are used to distinguish one element from another. Moreover, the terms "a" and "an" herein do not denote a limitation of quantity, but rather denote the presence of at least one of the referenced item. Further, the term "logic tile" means a design unit or block of a plurality of transistors (typically more than thousands), which, in this application, is capable of connecting to a plurality of neighboring logic tiles, logic cells, logic cores and/or logic blocks. The term (i) "integrated circuit" means, among other things, a processor, controller, state machine, gate array, SoC, PGA and/or FPGA. The term (i) "integrated circuit" also means a processor, controller, state machine and/or SOC—including an embedded FPGA. For the avoidance of doubt, field programmable gate array or FPGA means both an FPGA and an embedded FPGA.

In addition, the term "data" means, among other things, a current or voltage signal(s) (plural or singular) whether in an analog or a digital form, which may be a single bit (or the like) or multiple bits (or the like).

Further, in the claims, the term "initialization operation" means the power-up, start-up, initialization, re-initialization, configuration, and/or re-configuration operation of the robust type memory cells (or the storage elements thereof) and/or the integrated circuit. The term "data processing operations", in the claims, means operations including digital signal processing, encoding, decoding, encrypting, decrypting and/or other forms of data manipulation. In the claims, the term "controller" means processor, controller, state machine, SoC and the like (e.g., DSP).

What is claimed is:

1. An integrated circuit comprising:
   a bus;
   a processor, wherein the processor is connected to the bus; and
   programmable/configurable logic circuitry having a periphery, wherein the processor is disposed outside the periphery of the programmable/configurable logic circuitry, the programmable/configurable logic circuitry includes:
   a plurality of logic tiles, arranged in an array having a plurality of rows and columns, wherein at least one logic tile of the plurality of logic tiles is located completely within the interior of the periphery of the programmable/configurable logic circuitry and wherein:
   each logic tile of the array of logic tiles includes a plurality of I/Os located on the perimeter of the logic tile wherein a first portion of the I/Os are located on a perimeter of the logic tile that is interior to the periphery of the programmable/configurable logic circuitry, and
   the first portion of the plurality of I/Os of each logic tile of the plurality of the logic tiles are directly connected to the bus to provide data communication between the processor and the plurality of logic tiles; and
   wherein the bus is routed between each of the plurality of rows of logic tiles of the plurality of logic tiles.

2. The integrated circuit of claim 1 wherein:
   the bus is a multi-drop bus wherein the processor is configurable to provide direct communication to each logic tile of the plurality of logic tiles.

3. The integrated circuit of claim 1 wherein:
   the bus is a point-to-point bus wherein the processor is configurable to provide direct communication to each logic tile of the plurality of logic tiles.

4. The integrated circuit of claim 1 wherein:
   the bus is routed between each of the plurality of columns of logic tiles of the plurality of logic tiles.

5. The integrated circuit of claim 1 wherein:
   the processor is programmable to transmit re-configuration data to each logic tile of the plurality of logic tiles, after initialization of the programmable/configurable logic circuitry, to provide a modular computing array architecture.

6. An integrated circuit comprising:
   a multi-drop bus;
   a processor, wherein the processor is connected to the multi-drop bus; and programmable/configurable logic circuitry including a plurality of logic tiles, arranged in an array having a plurality of rows and columns, wherein the logic tiles form a periphery of the programmable/configurable logic circuitry, wherein the processor is disposed outside the periphery of the programmable/configurable logic circuitry, and wherein:
    each logic tile of the array of logic tiles includes a plurality of I/Os located on the perimeter of the logic tile, wherein:
        a first portion of the plurality of I/Os of the plurality of logic tiles are located on a perimeter of the logic tiles that is located interior to the periphery of the programmable/configurable logic circuitry, and
        a second portion of the I/Os of a subset of the plurality of logic tiles are located on a perimeter of the logic tiles that is located on the periphery of the programmable/configurable logic circuitry; and
wherein the multi-drop bus is:
    routed between each of the plurality of rows or each of the plurality of columns of logic tiles of the plurality of logic tiles, and
    directly connected to a plurality of the first portion of I/Os of each logic tile of the plurality of logic tiles to provide data communication between the processor and the plurality of logic tiles.

7. The integrated circuit of claim 6 wherein:
the processor is configurable to programmable to transmit re-configuration data to each logic tile of the plurality of logic tiles, after initialization of the programmable/configurable logic circuitry, to provide a modular computing array architecture.

8. The integrated circuit of claim 6 wherein:
the second portion of the I/Os of a subset of the plurality of logic tiles are configurable to provide direct communication to circuitry external to the programmable/configurable logic circuitry.

9. The integrated circuit of claim 6 further including:
a plurality of block random access memories, wherein each logic tile of the plurality of logic tiles is directly connected to and associated with a unique block random access memory.

10. The integrated circuit of claim 9 further including:
a memory bus, located adjacent to each block random access memory of the plurality of block random access memories to directly connect to the block random access memory wherein:
    the memory bus is configurable to provide direct communication with each block random access memory during operation of the programmable/configurable logic circuitry.

11. The integrated circuit of claim 10 wherein:
each block random access memory of the plurality of block random access memories includes dual-port memory for direct access from the memory bus and by circuitry of the associated logic tile.

12. The integrated circuit of claim 6 further including:
a plurality of block random access memories, wherein each block random access memory is adjacent and directly connected to a logic tile of the plurality of logic tiles.

13. The integrated circuit of claim 12 further including:
a memory bus, located adjacent to each block random access memory of the plurality of block random access memories to directly connect to the block random access memory wherein:
    the memory bus is capable of communicating with each block random access memory during operation of the programmable/configurable logic circuitry.

14. The integrated circuit of claim 12 further including:
a memory bus, located adjacent to each block random access memory of the plurality of block random access memories to directly connect to the block random access memory wherein the memory bus is a point-to-point bus.

15. An integrated circuit comprising:
a bus;
a processor, wherein the processor is connected to the bus; and
programmable/configurable logic circuitry including a plurality of logic tiles, arranged in an array having a plurality of rows and columns, wherein the logic tiles form a periphery of the programmable/configurable logic circuitry, wherein the processor is disposed outside the periphery of the programmable/configurable logic circuitry, wherein:
    each logic tile of the array of logic tiles includes a plurality of I/Os located on the perimeter of the logic tile, wherein a first portion of the plurality of I/Os of the plurality of the logic tiles are located on a perimeter of the logic tiles that is located interior to the periphery of the programmable/configurable logic circuitry wherein a plurality of the first portion of I/Os directly connect to the bus to provide data communication to/from the processor, and
wherein the bus is:
    connected to a plurality of block random access memories, wherein each block random access memory is directly connected to and associated with a logic tile of the plurality of logic tiles, and
    routed between (i) a plurality of rows of logic tiles of the plurality of logic tiles or (ii) a plurality of columns of logic tiles of the plurality of logic tiles.

16. The integrated circuit of claim 15 further including:
a memory bus, located adjacent to each block random access memory of the plurality of block random access memories to directly connect to the block random access memory wherein the memory bus is capable of communicating with each block random access memory during operation of the programmable/configurable logic circuitry.

17. The integrated circuit of claim 15 wherein:
the processor is programmable to transmit re-configuration data to each logic tile of the first plurality of logic tiles, after initialization of the programmable/configurable logic circuitry, to provide a modular computing array architecture.

18. The integrated circuit of claim 15 wherein:
the bus is a multi-drop bus wherein the processor is configurable to provide direct communication to at least a subset of the plurality of logic tiles.

19. The integrated circuit of claim 15 wherein:
the bus is a point-to-point bus wherein the processor is configurable to provide direct communication to at least a subset of the plurality of logic tiles.

20. An integrated circuit comprising:
a bus;
a processor, wherein the processor is connected to the bus;
programmable/configurable logic circuitry having a periphery, wherein the processor is disposed outside the periphery of the programmable/configurable logic circuitry, the programmable/configurable logic circuitry includes:

a plurality of logic tiles, arranged in an array having a plurality of rows and columns, wherein at least one logic tile of the plurality of logic tiles is located completely within the interior of the periphery of the programmable/configurable logic circuitry and wherein:

each logic tile of the array of logic tiles includes a plurality of I/Os located on the perimeter of the logic tile wherein a first portion of the I/Os are located on a perimeter of the logic tile that is interior to the periphery of the programmable/configurable logic circuitry, and the first portion of the plurality of I/Os of each logic tile of the plurality of the logic tiles are directly connected to the bus to provide data communication between the processor and the plurality of logic tiles; and wherein the bus is routed between each of the plurality of columns of logic tiles of the plurality of logic tiles.

21. The integrated circuit of claim 20 wherein:

the bus is a multi-drop bus wherein the processor is configurable to provide direct communication to each logic tile of the plurality of logic tiles.

22. The integrated circuit of claim 20 wherein:

the bus is a point-to-point bus wherein the processor is configurable to provide direct communication to each logic tile of the plurality of logic tiles.

23. The integrated circuit of claim 20 wherein:

the processor is programmable to transmit re-configuration data to each logic tile of the plurality of logic tiles, after initialization of the programmable/configurable logic circuitry, to provide a modular computing array architecture.

* * * * *